(12) United States Patent
Kim et al.

(10) Patent No.: US 11,501,170 B2
(45) Date of Patent: Nov. 15, 2022

(54) ELECTRONIC DEVICE AND METHOD OF OPERATING THE SAME

(71) Applicant: SK hynix Inc., Icheon-si (KR)

(72) Inventors: Dae Sung Kim, Icheon-si (KR); Soon Young Kang, Yongin-si (KR); Jang Seob Kim, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 252 days.

(21) Appl. No.: 16/880,546

(22) Filed: May 21, 2020

(65) Prior Publication Data

US 2021/0158169 A1 May 27, 2021

(30) Foreign Application Priority Data

Nov. 26, 2019 (KR) .......................... 10-2019-0153259

(51) Int. Cl.
*G06N 3/08* (2006.01)
*G06N 5/04* (2006.01)
(Continued)

(52) U.S. Cl.
CPC ............ *G06N 3/084* (2013.01); *G06F 17/18* (2013.01); *G06K 9/628* (2013.01); *G06K 9/6228* (2013.01);
(Continued)

(58) Field of Classification Search
CPC .......... G06N 3/084; G06N 5/046; G06N 3/04; G06N 3/0454; G06N 3/02; G06F 17/18;
(Continued)

(56) References Cited

U.S. PATENT DOCUMENTS

2018/0343017 A1* 11/2018 Kumar ..................... G06N 3/08
2019/0068220 A1* 2/2019 Kumar ................ G06F 12/0246
(Continued)

OTHER PUBLICATIONS

Amir Bennatan et al., "Deep Learning for Decoding of Linear Codes—A Syndrome-Based Approach", IEEE International Symposium on Information Theory (ISIT), 2018.
(Continued)

*Primary Examiner* — Juan A Torres
(74) *Attorney, Agent, or Firm* — Perkins Coie LLP

(57) ABSTRACT

Devices for using a neural network to choose an optimal error correction algorithm are disclosed. An example device includes a decoding controller inputting at least one of the number of primary unsatisfied check nodes (UCNs), the number of UCNs respectively corresponding to at least one iteration, and the number of correction bits respectively corresponding to the at least one iteration to a trained artificial neural network, and selecting any one of a first error correction decoding algorithm and a second error correction decoding algorithm based on an output of the trained artificial neural network corresponding to the input, and an error correction decoder performing error correction decoding on a read vector using the selected error correction decoding algorithm. The output of the trained artificial neural network may include a first predicted value indicating a possibility that a first error correction decoding using the first error correction decoding algorithm is successful.

20 Claims, 19 Drawing Sheets

(51) Int. Cl.
  *G06K 9/62*    (2022.01)
  *G06F 17/18*   (2006.01)
  *H03M 13/11*   (2006.01)

(52) U.S. Cl.
  CPC ........... *G06K 9/6256* (2013.01); *G06N 5/046* (2013.01); *H03M 13/1108* (2013.01); *H03M 13/1117* (2013.01)

(58) Field of Classification Search
  CPC .... G06K 9/6228; G06K 9/6256; G06K 9/628; H03M 13/1108; H03M 13/1117; H03M 13/6597; H03M 13/116; H03M 13/23; H03M 13/3707; H03M 13/3746
  USPC .......................................................... 726/25
  See application file for complete search history.

(56) References Cited

U.S. PATENT DOCUMENTS

| | | | | |
|---|---|---|---|---|
| 2020/0210816 A1* | 7/2020 | Luo | .................. | H03M 13/6597 |
| 2020/0313693 A1* | 10/2020 | Jo | ...................... | H03M 13/253 |
| 2020/0341829 A1* | 10/2020 | Kang | .................... | G06F 11/076 |
| 2021/0135688 A1* | 5/2021 | Zamir | ............... | H03M 13/3723 |
| 2021/0142158 A1* | 5/2021 | Agrawal | ............ | H03M 13/1111 |
| 2021/0143840 A1* | 5/2021 | Luo | .................. | H03M 13/1515 |

OTHER PUBLICATIONS

Loren Peter Lugosch, "Learning Algorithms for Error Correction", McGill University Libraries, Apr. 2018.

\* cited by examiner $$\begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix} \times \begin{bmatrix} C_{i1} \\ C_{i2} \\ C_{i3} \\ \vdots \\ C_{i7} \end{bmatrix} = \begin{bmatrix} S_{i1} \\ S_{i2} \\ S_{i3} \end{bmatrix}$$

H $\quad\quad\quad\quad\quad\quad\quad\quad C_i^T \quad\quad\quad S_i$

| QUANTIZATION LEVEL | LLR1 | LLR2 | LLR3 | LLR4 | LLR5 | LLR6 | LLR7 | LLR8 |
|---|---|---|---|---|---|---|---|---|
| 2 | -4 | +4 | | | | | | |
| 3 | -4 | -2 | +4 | | | | | |
| 4 | -4 | -2 | +2 | +4 | | | | |
| 5 | -4 | -3 | -2 | +2 | +4 | | | |
| 6 | -4 | -3 | -2 | -1 | +2 | +4 | | |
| 7 | -4 | -3 | -2 | -1 | +1 | +2 | +4 | |
| 8 | -4 | -3 | -2 | -1 | +1 | +2 | +3 | +4 |

ELECTRONIC DEVICE AND METHOD OF OPERATING THE SAME

CROSS-REFERENCE TO RELATED APPLICATION

This patent document claims priority to and benefits of the Korean patent application number 10-2019-0153259, filed on Nov. 26, 2019, which is incorporated herein by reference in its entirety.

TECHNICAL FIELD

The present disclosure relates to an electronic device and a method of operating the same. In some implementations, the electronic device is configured to use an artificial neural network.

BACKGROUND

An electronic device may include a storage medium that temporarily or permanently stores data. During various operations, such as writing, reading, transmission or processing, data error or data corruption may occur.

In order to ensure reliability of data, the electronic device may use error correction techniques such as error correction encoding and error correction decoding.

SUMMARY

Embodiments of the disclosed technology relate to an electronic device and a method of operating the same, which enable optimal selection of an error correction decoding algorithm. In an example, the electronic device is capable of retraining an artificial neural network using a result of error correction decoding.

An electronic device according to an embodiment of the present disclosure includes a decoding controller configured to input at least one of the number of primary unsatisfied check nodes (UCNs), the number of UCNs respectively corresponding to at least one iteration, and the number of correction bits respectively corresponding to the at least one iteration to a trained artificial neural network, and to select any one of a first error correction decoding algorithm and a second error correction decoding algorithm based on an output of the trained artificial neural network corresponding to the input, and an error correction decoder configured to perform error correction decoding on a read vector using the selected error correction decoding algorithm. The output of the trained artificial neural network includes a first predicted value indicating a possibility that a first error correction decoding using the first error correction decoding algorithm is successful.

Another electronic device according to an embodiment of the present disclosure includes a decoding controller configured to transmit, to a trained artificial neural network, a first input comprising at least one of a number of primary unsatisfied check nodes (UCNs), a number of UCNs corresponding to at least one iteration, and a number of correction bits corresponding to the at least one iteration, and select, based on an output of the trained artificial neural network corresponding to the first input, either a first error correction decoding algorithm or a second error correction decoding algorithm, and an error correction decoder configured to perform an error correction decoding operation on a read vector using the selected error correction decoding algorithm, wherein the output of the trained artificial neural network includes a first predicted value indicative of a probability that a first error correction decoding operation using the first error correction decoding algorithm is successful.

A method of operating an electronic device according to an embodiment of the present disclosure includes inputting at least one of the number of primary unsatisfied check nodes (UCNs), the number of UCNs respectively corresponding to at least one iteration, and the number of correction bits respectively corresponding to the at least one iteration to a trained artificial neural network, selecting any one of a first error correction decoding algorithm and a second error correction decoding algorithm based on an output of the trained artificial neural network corresponding to the input, and performing error correction decoding on a read vector using the selected error correction decoding algorithm. The output of the trained artificial neural network includes a first predicted value indicating a possibility that a first error correction decoding using the first error correction decoding algorithm is successful.

Another method of operating an electronic device according to an embodiment of the present disclosure includes transmitting, to a trained artificial neural network, an input comprising at least one of a number of primary unsatisfied check nodes (UCNs), a number of UCNs corresponding to at least one iteration, and a number of correction bits corresponding to the at least one iteration, selecting, based on an output of the trained artificial neural network corresponding to the input, either a first error correction decoding algorithm or a second error correction decoding algorithm, and performing an error correction decoding operation on a read vector using the selected error correction decoding algorithm, wherein the output of the trained artificial neural network includes a first predicted value indicative of a probability that a first error correction decoding operation using the first error correction decoding algorithm is successful.

In some embodiments of the presently disclosed technology, the selection of the error correction decoding algorithm may be optimally performed, and thus, a throughput of the electronic device may be improved and power consumption may be reduced.

BRIEF DESCRIPTION OF THE DRAWINGS

Example embodiments will now be described hereinafter with reference to the accompanying drawings; however, they may be embodied in different forms and should not be construed as limited to the embodiments set forth herein.

DETAILED DESCRIPTION

Figure 1:
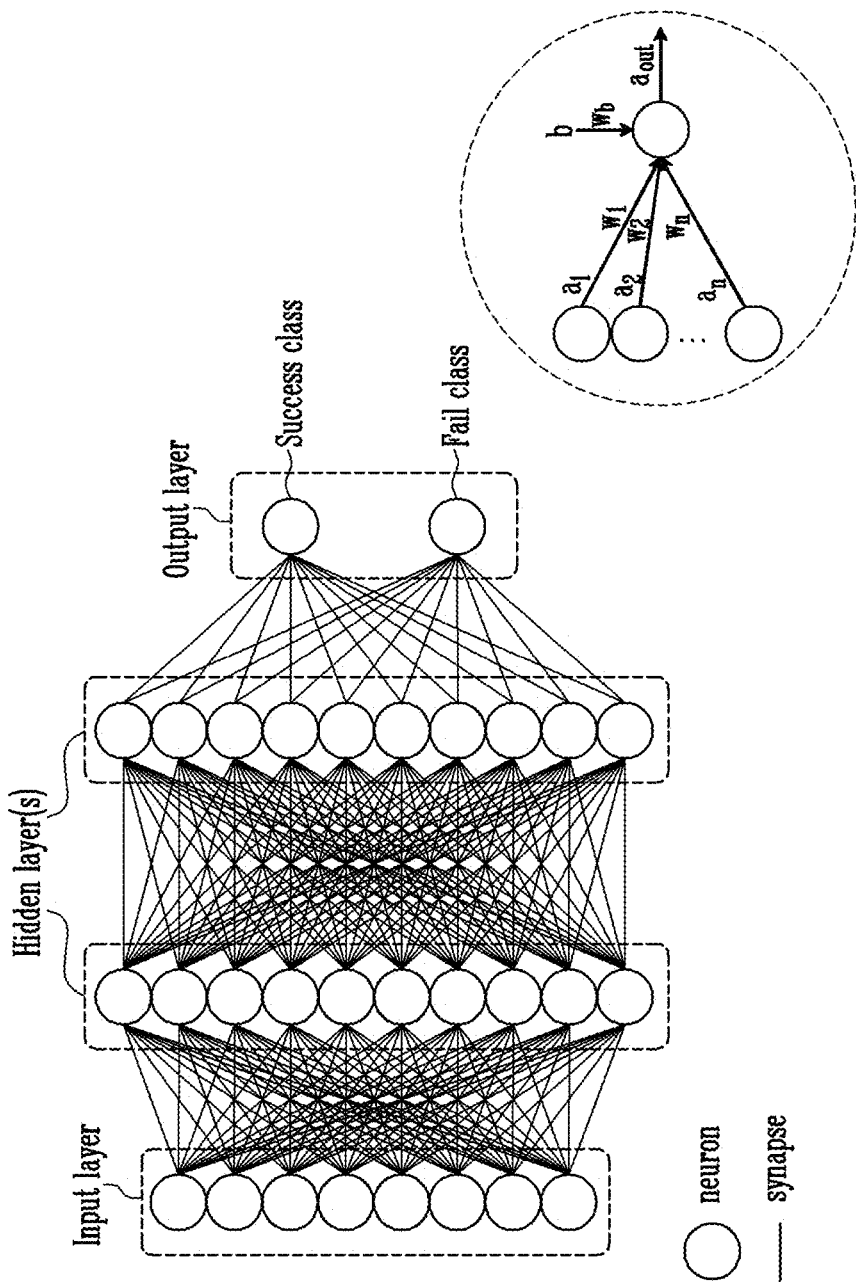
FIG. 1 is an example diagram illustrating an artificial neural network.

FIG. 1 is an example diagram illustrating an artificial neural network.

As shown therein, the artificial neural network may include an input layer, at least one hidden layer, and an output layer. Each of the input layer, the hidden layer, and the output layer may include a plurality of neurons (alternatively referred to as nodes). With regard to terminology, a neuron in the input layer is referred to as an input neuron, a neuron in the hidden layer is referred to as a hidden neuron, and a neuron present in the output layer is referred to as an output neuron.

In some embodiments, the artificial neural network may be trained based on a supervised learning method or an unsupervised learning method.

When the supervised learning method is used during training, labeled training data may be input to the artificial neural network. For example, the labeled training data may be labeled as a "success" or a "failure" before it is input to the artificial neural network.

In some embodiments, at least one forward propagation operation and at least one backpropagation operation may be performed in the artificial neural network while the training is performed.

During the forward propagation operation, each of the neurons may calculate output value $a_{out}$ based on an activation function. For example, the output value $a_{out}$ may be calculated according to Equation 1.

$$a_{out} = g(z),$$ [Equation 1]

where $$z = bw_b + \sum_{j=1}^{a} a_j w_j$$

Herein, $g(z)$ denotes the activation function of the neuron, b denotes a bias value of the neuron, $w_b$ denotes a bias weight value of the neuron, $a_j$ denotes an output value received from a j-th neuron (j is a natural number) from the neurons in a previous layer, and $w_j$ denotes a weight value of a synapse connected to the j-th neuron. In some embodiments, the bias value b and the bias weight value $w_b$ may not be used when calculating the output value $a_{out}$.

When the forward propagation operation is performed up to the output neurons, the backpropagation operation may be performed to reduce an error value between output values calculated by the output neurons (i.e., predicted values) and the labelled values. During the backpropagation operation, the model parameters (e.g., the bias weight value $w_b$ of each of the neurons and the weight values $w_1, w_2, \ldots,$ and $w_n$ of the synapses) may be updated. For example, during the backpropagation operation, the most suitable combination of model parameters may be found in a direction of minimizing loss based on a cost function.

Figure 2:
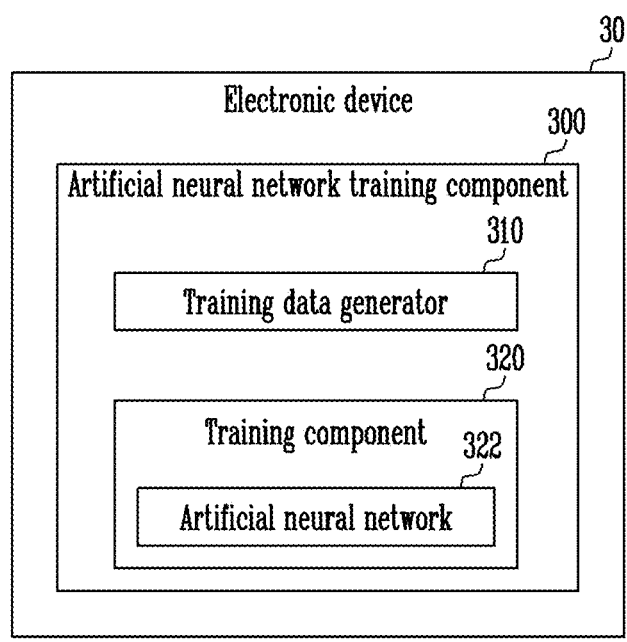
FIG. 2 is an example diagram illustrating an electronic device in accordance with an embodiment of the presently disclosed technology.

FIG. 2 is an example diagram illustrating an electronic device in accordance with an embodiment of the presently disclosed.

In some embodiments, the electronic device 30 may include a computer, a memory controller, an error correction circuit, or an error correction decoder. In other embodiments, the electronic device 30 may be included in the memory controller, the error correction circuit, or the error correction decoder.

In the described embodiments, the electronic device 30 may include an artificial neural network training component 300.

The artificial neural network training component 300 may include a training data generator 310 and a training component 320.

In some embodiments, the training data generator 310 may generate at least one labeled training data used to train an artificial neural network 322. One labeled training data may include a training input vector and at least one label value corresponding to the training input vector. In some embodiments, the at least one labeled training data may include a training input vector, a label value corresponding to a success class, and a label value corresponding to a failure class. In other embodiments, the at least one labeled training data may include the training input vector and a label value corresponding to the success class.

In some embodiments, the training data generator 310 may generate training data that has been labeled based on information generated in a test error correction decoding process performed using a first error correction decoding algorithm with respect to a test vector. In an example, the test vector may be a vector in which an error has been introduced in a codeword generated using a predetermined error correction encoding algorithm. The test error correction decoding may be performed using any iterative error correction decoding algorithm. The information generated in the test error correction decoding process may include, for example, at least one of the number of primary unsatisfied check nodes (UCNs), the number of UCNs corresponding to i-th (i is a natural number) iteration, the number of correction bits corresponding to the i-th iteration, and test decoding result information indicating whether the test error correction decoding was successful. The number of primary UCNs may be the number of non-zero entries of a syndrome vector generated by multiplying a parity check matrix of an error correction code and the test vector. The number of UCNs corresponding to the i-th iteration may be the number of non-zero entries of a syndrome vector generated by multiplying the parity check matrix and a hard-decision vector corresponding to the i-th iteration. The number of correction bits corresponding to the i-th iteration may be the number of variable nodes to which a hard-decision value is flipped at the i-th iteration.

In an example, the training data generator 310 may generate a training input vector that includes the number of primary UCNs, the number of UCNs corresponding to the i-th iteration, and the number of correction bits corresponding to the i-th iteration. In another example, the training data generator 310 may generate a training input vector that includes the number of primary UCNs and the number of UCNs corresponding to the i-th iteration.

In some embodiments, the information generated during the test error correction decoding process may be generated by a device that is outside the electronic device 30. For example, when the memory controller includes the electronic device 30 and the error correction circuit, the error correction circuit may perform the test error correction decoding and provide the information generated during the test error correction decoding process to the artificial neural network training component 300.

In some embodiments, the information generated during the test error correction decoding process may be generated by a device inside the electronic device 30. For example, when the electronic device 30 includes the artificial neural network training component 300 and the error correction circuit, the error correction circuit may perform the test error correction decoding and provide the information generated during the test error correction decoding process to the artificial neural network training component 300.

In some embodiments, the training data generator 310 may generate training data by labeling the training input vector based on test decoding result information. The labeling may mean setting a label value of an output neuron corresponding to a class to a discrete binary value.

In some embodiments, the output layer of the artificial neural network 322 may include an output neuron corresponding to the success class and an output neuron corresponding to the failure class. In other embodiments, the output layer may only include the output neuron corresponding to the success class.

In an example, the output layer of the artificial neural network 322 includes the output neuron corresponding to the success class and the output neuron corresponding to the failure class. In this example, when the test decoding result information indicates that the test error correction decoding is successful the training data generator 310 may label that training input vector as being in the success class. This results in a label value of the output neuron corresponding to the success class being set to "1" and a label value of the output neuron corresponding to the failure class being set to "0".

In another example, the output layer of the artificial neural network 322 includes the output neuron corresponding to the success class and the output neuron corresponding to the failure class. In this example, when the test decoding result information indicates that the test error correction decoding is a failure, the training data generator 310 may label that training input vector as being in the failure class. This results in the label value of the output neuron corresponding to the success class being set to "0" and the label value of the output neuron corresponding to the failure class being set to "1".

In yet another example, the output layer of the artificial neural network 322 includes only output neurons corresponding to the success class. Labeling for the training input vector to be in the success class may mean setting the label value of the output neuron corresponding to the success class to '1'. The labeling for the training input vector to be in the failure class may mean setting the label value of the output neuron corresponding to the success class to '0'.

In some embodiments, the training component 320 may train the artificial neural network 322 based on the supervised learning method using the training data received from the training data generator 310, for example, the labeled training input vector.

Figure 3:
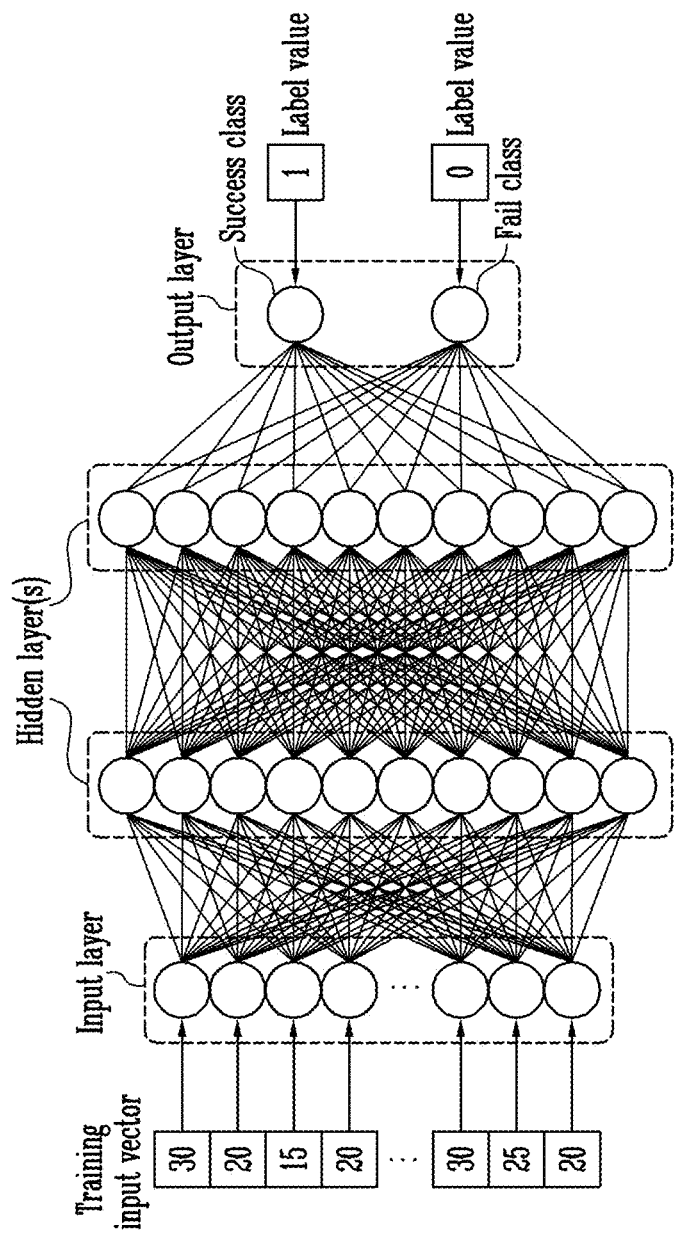
FIGS. 3 and 4 are exemplary example diagrams illustrating the training of the artificial neural network.
Figure 4:
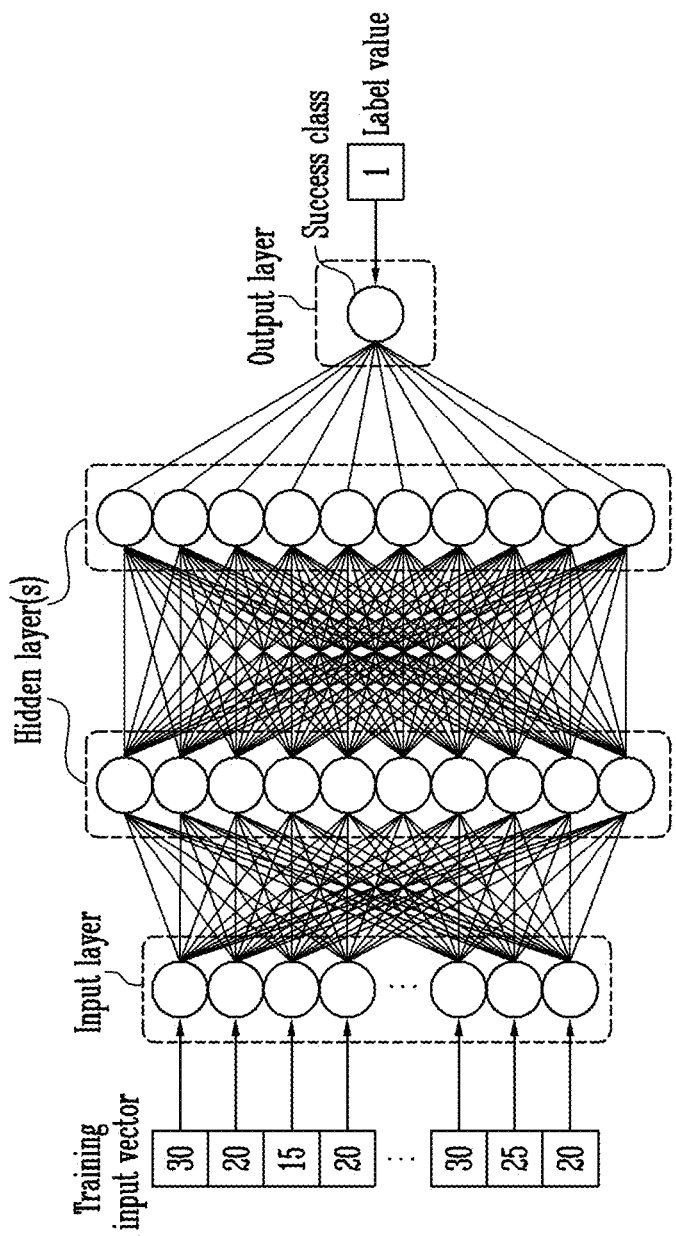

FIGS. 3 and 4 are example diagrams illustrating the training of the artificial neural network.

In some embodiments, hyper parameters are required for the training of the artificial neural network. In an example, the hyper parameters include at least one of the number of hidden layers, the number of hidden neurons, the number of input neurons, the number of output neurons, and a training rate that may be arbitrarily or experimentally determined.

In an example, the number of input neurons present in the input layer may be determined based on a length of the training input vector.

In another example, the number of output neurons present in the output layer may be arbitrarily or experimentally determined. For example, the number of output neurons may be one or two.

FIGS. 3 and 4 show an example of the training input vector {30, 20, 15, 20, . . . , 30, 25, 20} labeled as being in the success class.

As shown in FIG. 3, the output layer includes an output neuron corresponding to the success class (which is labeled with the value '1') and an output neuron corresponding to the failure class (which is labeled with the value '0'). In this example, the values included in the training input vector {30, 20, 15, 20, . . . , 30, 25, 20} are input one-by-one to the input neurons of the input layer.

As shown in FIG. 4, the output layer includes only an output neuron corresponding to the success class (which is labeled with the value '1'), and the values included in the training input vector {30, 20, 15, 20, . . . , 30, 25, 20} are input one-by-one to the input neurons of the input layer.

In some embodiments, the artificial neural network may be trained based on the input training input vector and the label value(s).

Figure 5:
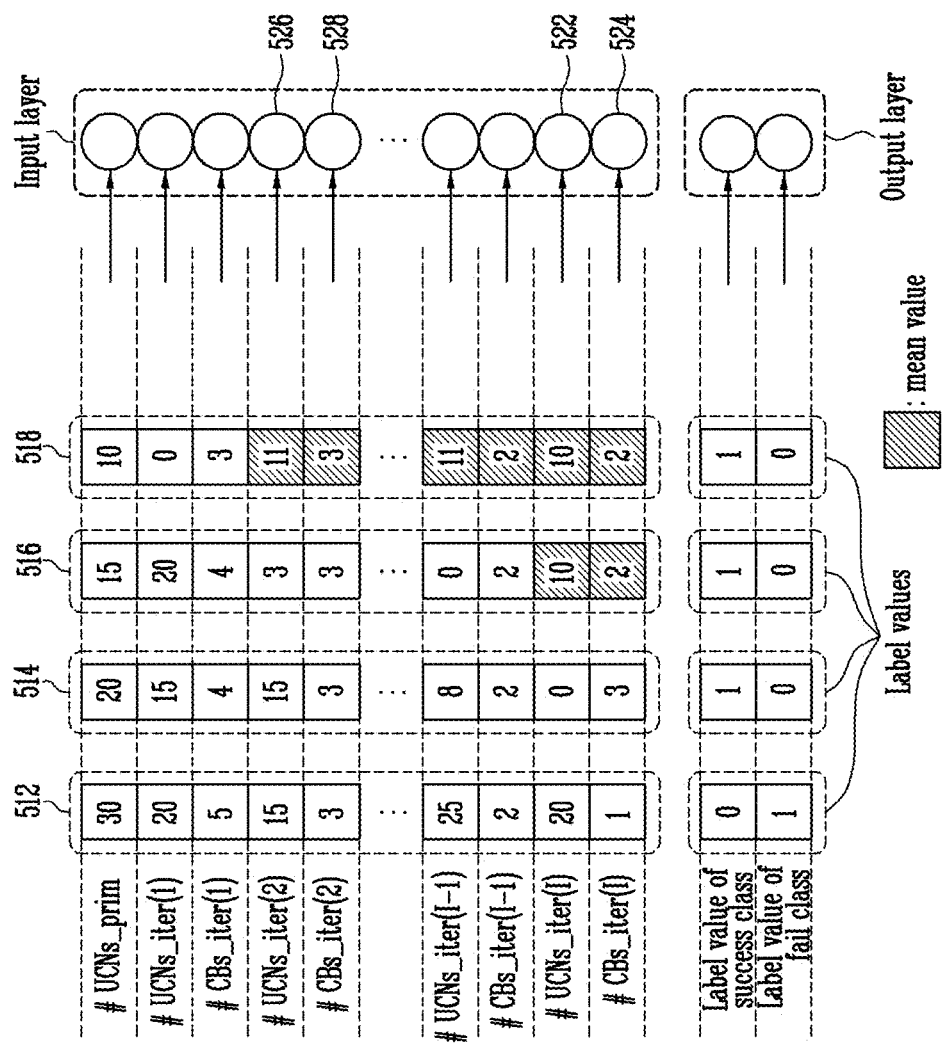
FIG. 5 is an example diagram illustrating a training input vector of a first type in accordance with an embodiment of the presently disclosed technology.

FIG. 5 is an example diagram illustrating a training input vector of a first type in accordance with an embodiment of the presently disclosed technology.

A training input vector of the first type may include the number of primary UCNs (denoted #UCNs_prim), the number of UCNs corresponding to an i-th iteration (denoted

UCNs_iter(i)), and the number of correction bits corresponding to the i-th iteration (denoted #CBs_iter(i)), where i is a natural number equal to or less than maximum number of iterations I.

As shown in the example in FIG. 5, four training input vectors 512, 514, 516, and 518 are associated with their corresponding label values. In an example, the training input vectors 512, 514, 516, and 518 may be generated based on information generated in the test error correction decoding process for different test vectors.

The training input vector 512 may be a vector generated when the number of iterations performed is equal to the maximum number of iterations I in the test error correction decoding on the test vector and the test error correction decoding has failed. As a result, among the label values corresponding to the training input vector 512, the label value corresponding to the success class may be set to '0' and the label value corresponding to the failure class may be set '1'.

The training input vector 514 may be a vector generated when the number of iterations performed is equal to the maximum number of iterations I in the test error correction decoding on the test vector and the test error correction decoding is successful in the I-th iteration. As a result, among the label values corresponding to the training input vector 514, the label value corresponding to the success class may be set to '1' and the label value corresponding to the failure class may be set to '0'.

The training input vector 516 may be a vector generated when the test error correction decoding is successful in an (I−1)-th iteration during the test error correction decoding on the test vector. As a result, among the label values corresponding to the training input vector 516, the label value corresponding to the success class may be set to '1' and the label value corresponding to the failure class may be set to '0'.

The training input vector 518 may be a vector generated when the test error correction decoding is successful in a first iteration during the test error correction decoding on the test vector. As a result, among the label values corresponding to the training input vector 516, the label value corresponding to the success class may be set to '1' and the label value corresponding to the failure class may be set to '0'.

The training input vectors 512, 514, 516, and 518 may be used to train the same artificial neural network or may be used to train different artificial neural networks.

In some embodiments, the training input vectors 512 and 514 may be used to train an artificial neural network that includes 2I+1 input neurons, the training input vector 516 may be used to train an artificial neural network that includes 2I−1 input neurons, and the training input vector 518 may be used to train an artificial neural network that includes three input neurons.

In some embodiments, the training input vectors 512, 514, 516, and 518 may be used to train an artificial neural network that includes 2I+1 input neurons.

For an example, the training input vectors 512 and 514 are used to train the artificial neural network that includes 2I+1 input neurons. In this case, each of the training input vectors 512 and 514 that comprise 2I+1 values may be input one-by-one to each of the 2I+1 input neurons.

For another example, the training input vector 516 is used to train the artificial neural network that includes 2I+1 input neurons. In this case, the training input vector 516 that includes 2I−1 values may be input one-by-one to 2I−1 input neurons, which exclude the two input neurons 522 and 524 from the total 2I+1 input neurons. Herein, a predetermined value may be input to the input neurons 522 and 524. In an example, the predetermined value may be a mean value corresponding to each of the input neurons 522 and 524. In the example shown in FIG. 5, an average value of 10, based on the values 20 and 0 corresponding to the input neuron 522 among values included in the training input vectors 512 and 514, respectively, may be input to the input neuron 522. Similarly, an average value of 2, based on the values 1 and 3 corresponding to the input neuron 524 among values included in the training input vectors 512 and 514, respectively, may be input to the input neuron 524.

The same principle may be applied to the case where the training input vector 518 is used to train the artificial neural network that includes 2I+1 input neurons. For example, an average value of 11, based on the values 15, 15, and 3 corresponding to the input neuron 526 among values included in the training input vectors 512, 514, and 516, respectively, may be input to the input neuron 526. Similarly, an average value 3, based on the values 3, 3, and 3 corresponding to the input neuron 528 among values included in the training input vectors 512, 514, and 516, respectively, may be input to the input neuron 528.

Figure 6:
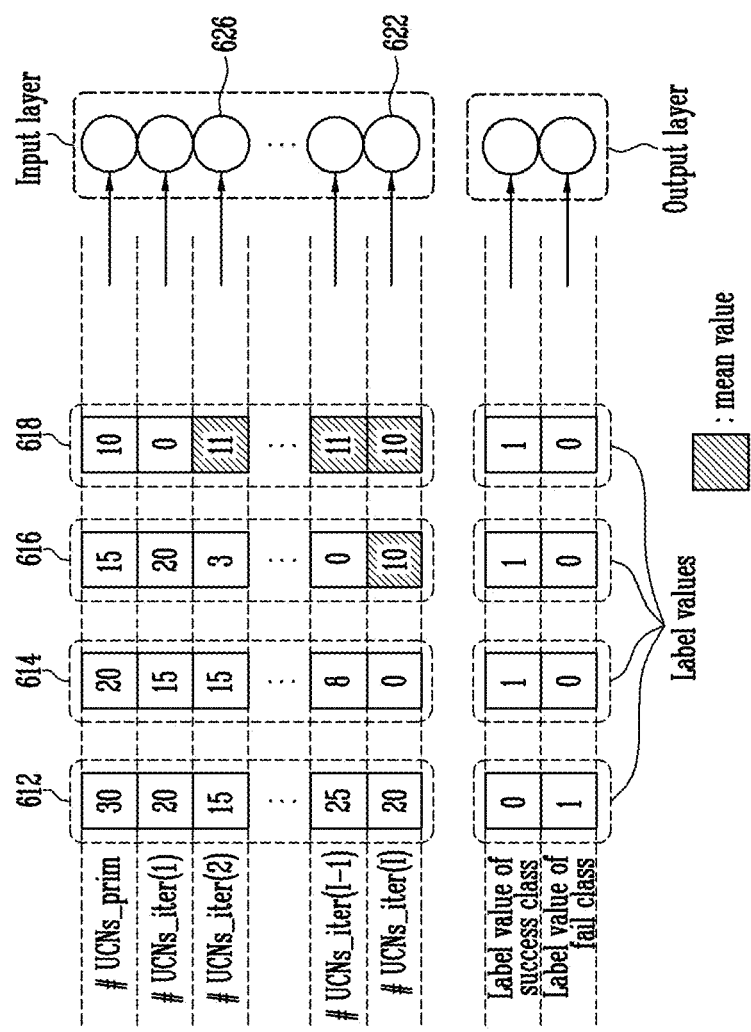
FIG. 6 is an example diagram illustrating a training input vector of a second type in accordance with an embodiment of the presently disclosed technology.

FIG. 6 is an example diagram illustrating a training input vector of a second type in accordance with an embodiment of the presently disclosed technology.

A training input vector of the second type may include the number of primary UCNs (denoted #UCNs_prim) and the number of UCNs corresponding to the i-th iteration (denoted #UCNs_iter(i)), where i is a natural number equal to or less than the maximum number of iterations I.

As shown in the example in FIG. 6, four training input vectors 612, 614, 616, and 618 are associated with their corresponding label values. In an example, the training input vectors 612, 614, 616, and 618 may be generated based on information generated in the test error correction decoding process for different test vectors.

The training input vectors 612, 614, 616, and 618 shown in FIG. 6 are vectors in which the number of corrections bits (#CBs_iter(i)) corresponding to the i-th iteration are excluded from the training input vectors 512, 514, 516, and 518 shown in FIG. 5. Therefore, some portions of the description with reference to FIG. 5 are omitted for conciseness.

The training input vectors 612, 614, 616, and 618 may be used to train the same artificial neural network or may be used to train different artificial neural networks.

In some embodiments, the training input vectors 612 and 614 may be used to train an artificial neural network that includes I+1 input neurons, the training input vector 616 may be used to train an artificial neural network that includes I input neurons, and the training input vector 618 may be used to train an artificial neural network that includes three input neurons.

In some embodiments, the training input vectors 612, 614, 616, and 618 may be used to train an artificial neural network that includes I+1 input neurons.

For an example, the training input vectors 612 and 614 are used to train the artificial neural network that includes I+1 input neurons. In this case, each of the training input vectors 612 and 614 that comprise I+1 values may be input one-by-one to each of the I+1 input neurons.

For another example, the training input vector 616 is used to train the artificial neural network that includes I+1 input neurons. In this case, the training input vector 616 that includes I values may be input one-by-one to the I input neurons, which exclude the input neuron 622 from the total I+1 input neurons. Herein, a predetermined value may be input to the input neuron 622. In an example, the predetermined value may be a mean value corresponding to the input neuron 622. In the example shown in FIG. 6, an average value of 10, based on the values 20 and 0 corresponding to the input neuron 622 among values included in the training input vectors 612 and 614, respectively, may be input to the input neuron 622.

The same principle may be applied to the case where the training input vector 618 is used to train the artificial neural network that includes I+1 input neurons. For example, an average value of 11, based on the values 15, 15, and 3 corresponding to the input neuron 626 among values included in the training input vectors 612, 614, and 616, respectively, may be input to the input neuron 626.

Figure 7:
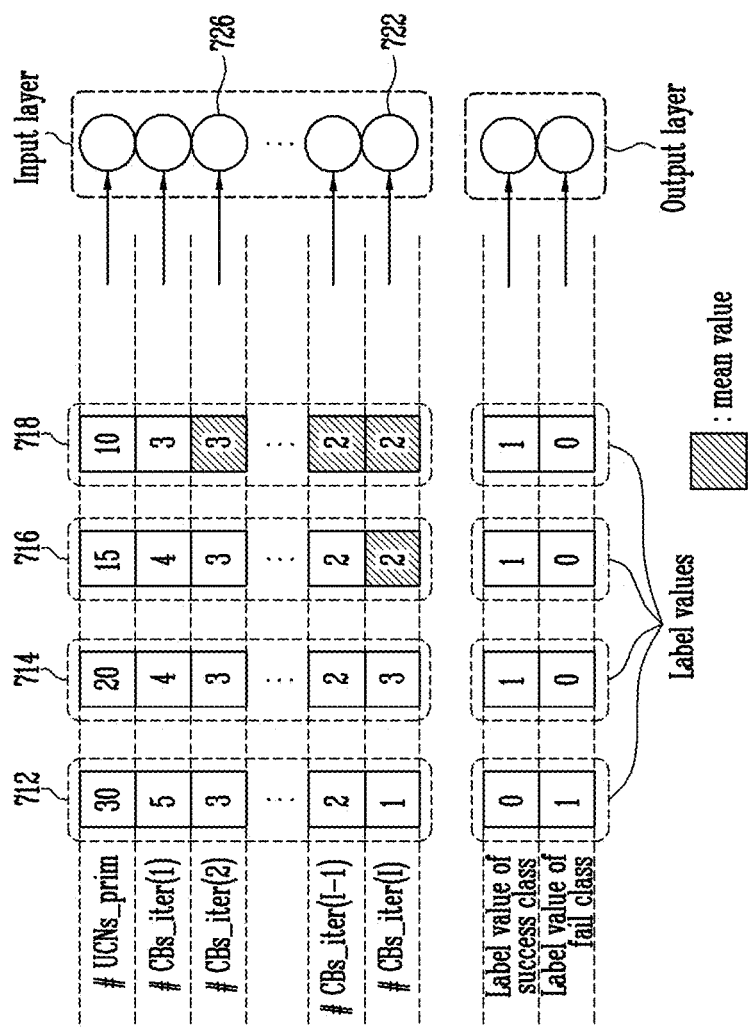
FIG. 7 is an example diagram illustrating a training input vector of a third type in accordance with an embodiment of the presently disclosed technology.

FIG. 7 is an example diagram illustrating a training input vector of a third type in accordance with an embodiment of the presently disclosed technology.

A training input vector of the third type may include the number of primary UCNs (denoted #UCNs_prim) and the number of correction bits (denoted #CBs_iter(i)) corresponding to the i-th iteration, where i is a natural number equal to or less than the maximum number of iterations I.

As shown in the example in FIG. 7, four training input vectors 712, 714, 716, and 718 are associated with their corresponding label values. In an example, the training input vectors 712, 714, 716, and 718 may be generated based on information generated in the test error correction decoding process for different test vectors.

The training input vectors 712, 714, 716, and 718 shown in FIG. 7 are vectors in which the number of UCNs (#UCNs_iter(i)) corresponding to the i-th iteration is excluded from the training input vectors 512, 514, 516, and 518 shown in FIG. 5. Therefore, some portions of the description with reference to FIG. 5 are omitted for conciseness.

The training input vectors 712, 714, 716, and 718 may be used to train the same artificial neural network or may be used to train different artificial neural networks.

In some embodiments, the training input vectors 712 and 714 may be used to train an artificial neural network that includes I+1 input neurons, the training input vector 716 may be used to train an artificial neural network that includes I input neurons, and the training input vector 718 may be used to train an artificial neural network that includes three input neurons.

In some embodiments, the training input vectors 712, 714, 716, and 718 are used to train the artificial neural network that includes I+1 input neurons.

In an example, and with reference to FIG. 6, the training input vectors 712 and 714 are used to train the artificial neural network that includes the I+1 input neurons. In this case, the I+1 values of each of the training input vectors 712 and 714 may be input one-by-one to each of the I+1 input neurons.

For another example, and with reference to FIG. 6, the training input vector 716 is used to train the artificial neural network that includes the I+1 input neurons. In this case, the I values of training input vector 716 may be input one-by-one to the I input neurons, which excludes the input neuron 722 from the total I+1 input neurons. Herein, a predetermined value, for example, an average value of 2, based on the values 1 and 3 corresponding the input neuron 722 among values included in the training input vectors 712 and 714, respectively, may be input to the input neuron 722.

The same principle may be applied to the case where the training input vector 718 is used to train the artificial neural network that includes the I+1 input neurons. For example, an average value of 3, based on the values 3, 3, and 3 corresponding to the input neuron 726 among values included in the training input vectors 712, 714, and 716, respectively, may be input to the input neuron 726.

Figure 8:
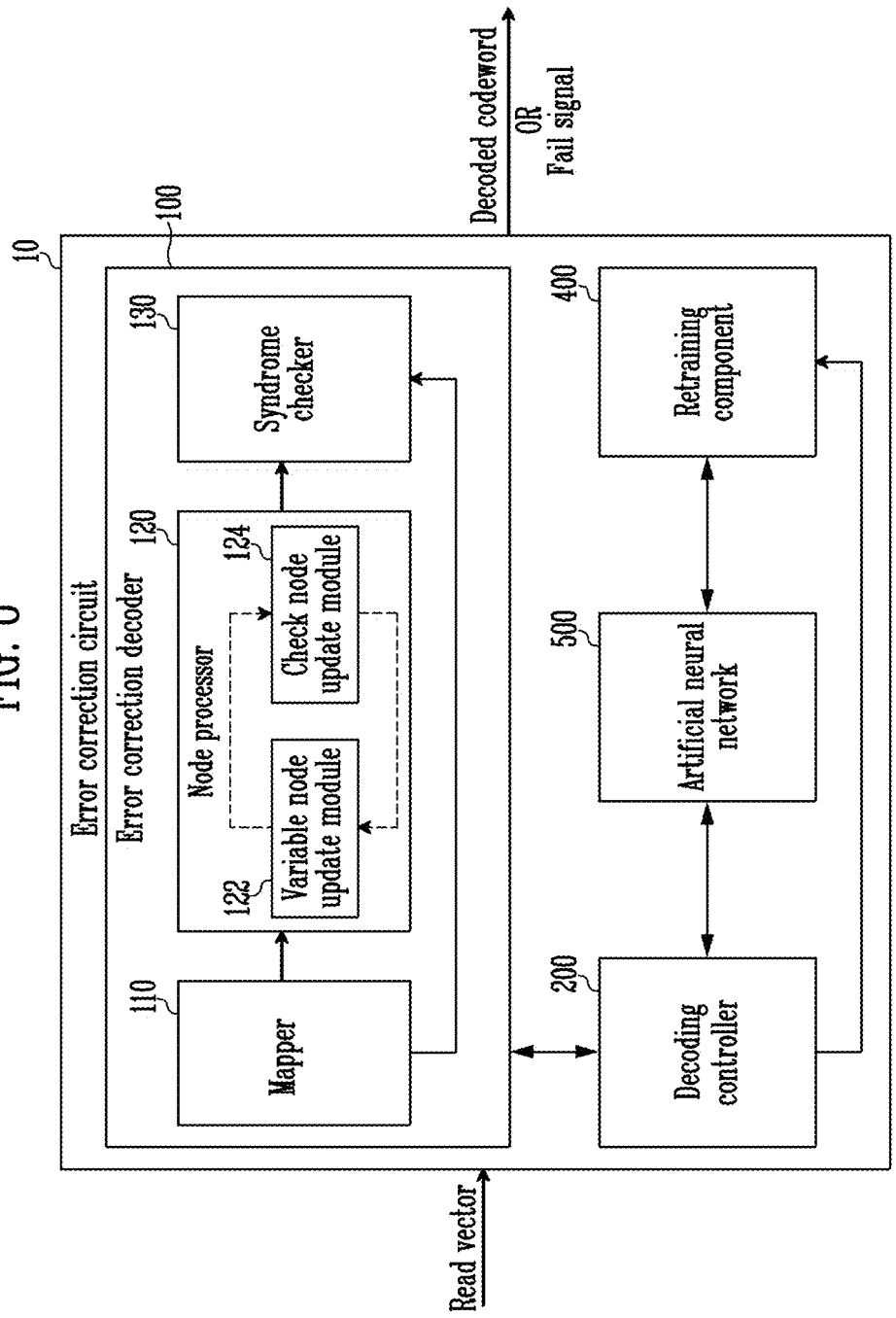
FIG. 8 is an example diagram for describing an error correction circuit in accordance with an embodiment of the presently disclosed technology.

FIG. 8 is an example diagram illustrating an error correction circuit in accordance with an embodiment of the presently disclosed technology.

In some embodiments, the error correction circuit 10 shown in FIG. 8 may be part of the electronic device 30 shown in FIG. 2.

In some embodiments, the error correction circuit 10 shown in FIG. 8 may include the electronic device 30 shown in FIG. 2.

In some embodiments, and referring to FIG. 8, the error correction circuit 10 may include an error correction decoder 100, a decoding controller 200, an artificial neural network 500, and a retraining component 400.

The error correction decoder 100 may receive a vector corresponding to a codeword from a channel. When the error correction circuit 10 is applied to a memory system, the vector received from the channel may be a read vector read from a memory device.

The error correction decoder 100 may perform error correction decoding using various iterative decoding algorithms. For example, the error correction decoder 100 may perform the error correction decoding using a message passing algorithm (MPA), which is also referred to as a belief propagation algorithm (BPA).

In some embodiments, the error correction decoder 100 may perform the error correction decoding using at least one of a bit-flipping algorithm, a min-sum algorithm, a sum-product algorithm, or any message passing algorithm.

The error correction decoder 100 may perform at least one iteration as long as the iteration index is less than the maximum number of iterations I set using the selected algorithm. Herein, I is a natural number. When a valid codeword that satisfies the constraints of a parity check matrix of an error correction code, as long as the iteration index is less than the maximum number of iterations I, is generated, the error correction decoder 100 may output the generated valid codeword as a decoded codeword. When the valid codeword that satisfies the constraints of the parity check matrix of the error correction code is not generated and the iteration index is less than the maximum number of iterations I, the error correction decoder 100 may output a failure signal indicating that the error correction decoding has failed.

In some embodiments, and as shown in FIG. 8, the error correction decoder 100 may include a mapper 110, a node processor 120, and a syndrome checker 130.

The mapper 110 is configured to receive the read vector from the channel. In an example, the read vector may be the result of reading a codeword stored in the memory device. Each of the read values of the read vector are '0' or '1'. The mapper 110 provides the received read vector to the syndrome checker 130.

The syndrome checker 130 is configured to perform a primary syndrome check based on the read vector received from the mapper 110 and the parity check matrix of the error correction code. In an example, the primary syndrome check may be performed by checking whether all entries of a syndrome vector $S_p$ calculated by Equation 2 are '0'.

$$S_p = H \cdot R^T \quad \text{[Equation 2]}$$

Herein, $S_p$ is the primary syndrome vector, H is the parity check matrix of the error correction code, and $R^T$ is a transposed vector of the read vector R.

Herein, a primary syndrome check has passed when all entries of the primary syndrome vector $S_p$ are '0', and the syndrome checker 130 may output the read vector as the decoded codeword.

However, if the primary syndrome vector $S_p$ contains a non-zero entry, then the primary syndrome check has failed, and an error is present in the read vector. When the primary syndrome check has failed, the syndrome checker 130 may provide the number of non-zero entries included in the primary syndrome vector, which is referred to as the number of primary UCNs, to the decoding controller 200.

The decoding controller 200 may select an algorithm to be used in the error correction decoder 100 and control the error correction decoder 100 to perform the error correction decoding using the selected algorithm.

In some embodiments, the decoding controller 200 may select an algorithm to be used in the error correction decoder 100 based on the read vector, the number of primary UCNs, and the artificial neural network 500.

In some embodiments, the artificial neural network 500 may be trained in advance to output at least one of a first predicted value corresponding to the success class and a second predicted value corresponding to the failure class, and based on the number of input UCNs (i.e., the number of primary UCNs). For example, the artificial neural network 500 may be an artificial neural network trained based on the embodiments described with reference to FIGS. 1 to 7. In some embodiments, the artificial neural network 500 may be included in the artificial neural network 322 shown in FIG. 2.

Herein, the first predicted value corresponding to the success class may be a value indicating a possibility that the error correction decoding is successful when the error correction decoding of the read vector using the first error correction decoding algorithm is performed. The second predicted value corresponding to the failure class may be a value indicating a possibility that the error correction decoding has failed when the error correction decoding on the read vector using the first error correction decoding algorithm is performed.

In some embodiments, and wherein the output neuron corresponding to the success class and the output neuron corresponding to the failure class are present in the output layer of the artificial neural network 500, the artificial neural network 500 may be trained in advance to output the first predicted value corresponding to the success class and the second predicted value corresponding to the failure class.

In some embodiments, wherein only the output neuron corresponding to the success class is present in the output layer of the artificial neural network 500, the artificial neural network 500 may be trained in advance to output the first predicted value corresponding to the success class.

The decoding controller 200 may input the number of primary UCNs to the input layer of the artificial neural network 500, and may select the algorithm to be used in the error correction decoder 100 based on the read vector. The algorithm is selected from amongst the first error correction decoding algorithm and the second error correction decoding algorithm, based on an output of the artificial neural network 500. In this scenario, the decoding controller 200 may input a predetermined value to the remaining input neurons except for the input neuron to which the number of primary UCNs is input. For example, when 2I+1 input neurons are present in the artificial neural network 500, the predetermined value may be input to remaining 2I input neurons except for the input neuron to which the number of primary UCNs is input. Herein, the predetermined value may be a value that does not significantly affect the output of the artificial neural network 500. For example, the predetermined value may be an average value of values corresponding to each input neuron among the values included in the training input vectors.

In some embodiments, the output of the artificial neural network 500 may include at least one of the first predicted value and the second predicted value. In other embodiments, the first predicted value and the second predicted value may be probabilities to which a logistic regression may be applied.

In some embodiments, and wherein the output of the artificial neural network 500 includes only the first predicted value or both the first and second predicted values, the decoding controller 200 may select the first error correction decoding algorithm when the first predicted value is equal to or greater than a first reference value and may select the second error correction decoding algorithm when the first predicted value is less than the first reference value. In an example, the first reference value may be a predetermined value.

In some embodiments, and wherein the output of the artificial neural network 500 includes the first and second predicted values, the first reference value may be the second predicted value. That is, the first error correction decoding algorithm may be selected when the first predicted value is equal to or greater than the second predicted value, and the second error correction decoding algorithm may be selected when the first predicted value is less than the second predicted value.

In some embodiments, the first error correction decoding algorithm may be an algorithm that consumes less resources, has a faster arithmetic operation rate, or has a lower error correction capability than the second error correction decoding algorithm. For an example, the first error correction decoding algorithm may be a bit-flipping algorithm and the second error correction decoding algorithm may be a min-sum algorithm or a sum-product algorithm. For another example, the first error correction decoding algorithm may be a min-sum algorithm and the second error correction decoding algorithm may be a sum-product algorithm.

In some embodiments, the decoding controller 200 may control at least one of the mapper 110 and the error correction decoder 100 to enable the error correction decoding to be performed using the error correction decoding algorithm selected based on the output of the artificial neural network 500.

In some embodiments, the decoding controller 200 may further select a power mode of the error correction decoding algorithm based on the output of the artificial neural network 500. The power mode may include a high power mode and a low power mode. The high power mode may be a mode in which higher power is consumed in comparison with the low power mode during the error correction decoding.

In some embodiments, wherein the output of the artificial neural network 500 includes only the first predicted value or both the first and second predicted values, when the first predicted value is equal to or greater than the first reference value and less than the second reference value, the decoding controller 200 may select the high power mode of the first error correction decoding algorithm, and when the first predicted value is equal to or greater than the second reference value, the decoding controller 200 may select the low power mode of the first error correction decoding algorithm. In an example, the second reference value may be arbitrarily or experimentally determined.

In some embodiments, wherein the output of the artificial neural network 500 includes only the first predicted value or both the first and second predicted values, when the first predicted value is less than the first reference value and equal to or greater than the third reference value, the decoding controller 200 may select the low power mode of the second error correction decoding algorithm, and when the first predicted value is less than the third reference value, the decoding controller 200 may select the high power mode of the second error correction decoding algorithm. In an example, the third reference value may be arbitrarily or experimentally determined.

For an example, the low power mode may be a power mode corresponding to hard decision decoding, and the high power mode may be a power mode corresponding to soft decision decoding. For example, the low power mode may be a min-sum algorithm that performs the hard decision decoding, and the high power mode may be a min-sum algorithm that performs the soft decision decoding.

For another example, the low power mode may be a power mode in which an unreliability value of a variable node is not used, and the high power mode may be a power mode in which the unreliability value of the variable node is used. When the unreliability value is used, since an additional memory and an additional process are required, power consumption is higher than in a case where the unreliability value is not used. For example, the number of unsatisfied check nodes (UCNs) connected to the variable node is required to be equal to or greater than a first threshold value so that a value of the variable node flips during the error correction decoding using the bit-flipping algorithm. However, even though the variable node is a variable node for which the number of connected UCNs is less than the first threshold value, it may be difficult to guarantee the reliability of the value of the variable node when the number of connected UCNs is large. Therefore, a method of setting the unreliability value at the variable node may be used. For example, after setting an unreliability value at the variable node where the number of connected UCNs is equal to or greater than a second threshold value and less than the first threshold value, when the number of UCNs connected to the variable node is equal to or greater than the second threshold value and less than the first threshold value in a subsequent iteration, the value of the variable node may be flipped. In an example, the first threshold value and the second threshold value may be arbitrarily or experimentally determined.

For yet another example, the low power mode may be a power mode that uses relatively low bit precision as compared to the high power mode. For example, when a min-sum algorithm is used, messages (for example, messages that represent a log log-likelihood ratio LLR value) having a real number are exchanged between variable nodes and check nodes. As the bit precision of the messages increases, an error correction capability may increase, but power consumption also increases.

The decoding controller 200 may control the error correction decoder 100 to perform the error correction decoding using the selected power mode of the selected error correction algorithm.

When the bit-flipping algorithm is selected, the mapper 110 may provide the read vector to node processor 120.

When the min-sum algorithm or sum-product algorithm is selected, the mapper 110 may generate an initial log-likelihood ratio (LLR) vector based on the read vector, and provide the initial LLR vector to the node processor 120. In an example, the initial LLR vector may be generated from a single read vector corresponding to a codeword when the low power mode is selected, or the initial LLR vector may be generated from a plurality of read vectors corresponding to a codeword when the high power mode is selected. For example, the plurality of read vectors may be read vectors obtained by using different read voltages.

In some embodiments, the node processor 120 may perform the error correction decoding using a message passing algorithm. In the message passing algorithm, convergence to a codeword may be achieved based on an exchange of messages between the variable nodes and the check nodes. These messages may include a variable to check (V2C) message transmitted from the variable node to the check node and a check to variable (C2V) message transmitted from the check node to the variable node.

The node processor 120 may perform at least one iteration when the iteration index is less than the maximum number of iterations I. The node processor 120 may include a variable node update module 122 and a check node update module 124.

When the bit-flipping algorithm is selected, the variable node update module 122 may initialize the variable nodes using the read vector received from the mapper 110. For example, the variable node update module 122 may assign read values included in the read vectors one-by-one to each of the variable nodes.

When the min-sum algorithm or the sum-product algorithm is selected, the variable node update module 122 may initialize the variable nodes using the initial LLR vector received from the mapper 110. For example, the variable node update module 122 may assign initial LLR values included in the initial LLR vector one-by-one to each of the variable nodes.

In each iteration, the variable node update module 122 may generate the V2C messages based on the currently selected algorithm and transmit the generated V2C messages to check node update module 124. The V2C messages may be generated based on the read values assigned to the variable nodes or the initial LLR values, and the C2V messages received from check node update module 124. In each iteration, the variable node update module 122 may update the values of the variable nodes based on the currently selected algorithm. The values of the variable nodes may be updated based on the read values assigned to the variable nodes or the initial LLR values, and the C2V messages received from the check node update module 124. The values of the variable nodes may include at least one of a hard decision value of the variable nodes, a posteriori probability of the variable nodes, or an unreliability value of the variable nodes.

In each iteration, the check node update module 124 may generate the C2V messages based on the currently selected algorithm, and transmit the generated C2V messages to the variable node update module 122. The C2V messages may be generated based on the V2C messages received from the variable node update module 122.

In some embodiments, the variable node update module 122 and the check node update module 124 may generate the V2C messages and the C2V messages based on the bit precision corresponding to the selected power mode. For example, the V2C messages and the C2V messages may be represented by 4 bits in the low power mode and may be represented by 8 bits in the high power mode.

In some embodiments, the node processor 120 may provide hard decision values (hereinafter, referred to as a hard decision vector $C_i$) of the variable nodes corresponding to the i-th iteration to the syndrome checker 130, wherein i is a natural number equal to or less than the maximum number of iterations I.

In some embodiments, the node processor 120 may provide the number of correction bits corresponding to the i-th iteration to the decoding controller 200. For example, the node processor 120 may calculate the number of correction bits for which the hard decision value was inverted in the i-th iteration, and provide the calculated number of correction bits to the decoding controller 200. Herein, the node processor 120 may compare the hard decision vector corresponding to the (i−1)-th iteration with the hard decision vector corresponding to the i-th iteration to calculate the number of correction bits corresponding to the i-th iteration.

When a valid codeword satisfying the constraints of the parity check matrix of the error correction code is generated as long as the iteration index is less than the maximum number of iterations I, the syndrome checker 130 may output the generated valid codeword as the decoded codeword. For example, the syndrome checker 130 may perform a syndrome check on a hard decision vector Ci received from the node processor 120 in the i-th iteration. Herein, the syndrome check may be performed by checking whether all entries of a syndrome vector Si calculated by Equation 3 are '0'.

$$S_i = H \cdot C_i^T \qquad \text{[Equation 3]}$$

Herein, $S_i$ denotes the syndrome vector corresponding to the i-th iteration, H denotes the parity check matrix of the error correction code, and $C_i^T$ denotes a transposed vector of the hard decision vector Ci corresponding to the i-th iteration.

A syndrome check has passed when all entries of the syndrome vector Si are '0', which means that the error correction decoding has been successfully performed in the i-th iteration, and thus the syndrome checker 130 may output the hard decision vector Ci as the decoded codeword.

On the other hand, the syndrome check fails when there is a non-zero entry among the entries of the syndrome vector Si, and thus the node processor 120 may perform an (i+1)-th iteration if the iteration index is less than the maximum number of iterations I.

In some embodiments, when the error correction decoding has failed in the i-th iteration, the syndrome checker 130 may calculate the number of UCNs corresponding to the i-th iteration and provide the calculated the number of UCNs corresponding to the i-th iteration to the decoding controller 200.

In some embodiments, the decoding controller 200 may determine whether to perform the second error correction decoding while performing the first error correction decoding using the first error correction decoding algorithm selected based on the number of primary UCNs.

In some embodiments, while performing the first error correction decoding, the decoding controller 200 may input at least one of the number of primary UCNs, the number of UCNs corresponding to the i-th iteration, and the number of correction bits corresponding to the i-th iteration to the artificial neural network 500, and may determine whether to perform the second error correction decoding based on the output of the artificial neural network 500.

In some embodiments, wherein the output of the artificial neural network 500 includes only the first predicted value or both the first and second predicted values, when the first predicted value corresponding to the success class of the output of the trained artificial neural network 500 is less than the first reference value, the decoding controller 200 may control at least one of the mapper 110 and the node processor 120 to end the first error correction decoding algorithm and perform the second error correction decoding on the read vector using the second error correction decoding algorithm. Herein, the mapper 110 may generate the initial LLR vector corresponding to the read vector and provide the initial LLR vector to the node processor 120, and the node processor 120 may perform the second error correction decoding based on the initial LLR vector received from the mapper 110. The first reference value may be a predetermined value or the second predicted value.

In some embodiments, when the first predicted value corresponding to the success class of the output of the trained artificial neural network 500 is equal to or greater than the first reference value, the decoding controller 200 may control the node processor 120 so that the first error correction decoding using the first error correction decoding algorithm is continuously performed.

In some embodiments, the decoding controller 200 may determine whether to perform the second error correction decoding at every iteration while performing the first error correction decoding. That is, whenever each iteration of the first error correction decoding has completed, the decoding controller 200 may input at least one of the number of primary UCNs, the number of UCNs corresponding to the i-th iteration, and the number of correction bits corresponding to the i-th iteration to the artificial neural network 500, and may determine whether to perform the second error correction decoding based on the output of the artificial neural network 500.

In some embodiments, the decoding controller 200 may determine whether to perform the second error correction decoding considering for at least one of the number of UCNs corresponding to the i-th iteration and the number of correction bits corresponding to the i-th iteration.

In some embodiments, the decoding controller 200 may determine whether to perform the second error correction decoding in an iteration satisfying at least one of a case where the number of UCNs corresponding to the i-th iteration exceeds a third threshold value and a case where the number of correction bits corresponding to the i-th iteration is less than a fourth threshold value. In an example, the third threshold value and the fourth threshold value may be arbitrarily or experimentally determined.

In some embodiments, the error correction decoder 100 may include at least one of a first hardware capable of performing the error correction decoding using the bit-flipping algorithm, a second hardware capable of performing the error correction decoding using the min-sum algorithm, and a third hardware capable of performing the error correction decoding using the sum-product algorithm. Herein, the first hardware may operate when the bit-flipping algorithm is selected, the second hardware may operate when the min-sum algorithm is selected, and the third hardware may operate when the sum-product algorithm is selected.

In some embodiments, the first hardware may be configured not to use the unreliability value of the variable node when the low power mode of the bit-flipping algorithm is selected. Alternatively, the first hardware may be configured to use the unreliability value of the variable node when the high power mode of the bit-flipping algorithm is selected.

In some embodiments, the second hardware may be configured to use a first bit precision when the low power mode of the min-sum algorithm is selected. Alternatively, the second hardware may be configured to use a second bit precision when the high power mode of the min-sum algorithm is selected. The second bit precision may be higher than the first bit precision.

In some embodiments, the second hardware may be configured not to scale the messages exchanged between the variable nodes and the check nodes when the low power mode of the min-sum algorithm is selected. Alternatively, the second hardware may be configured to scale the messages exchanged between the variable nodes and the check nodes when the high power mode of the min-sum algorithm is selected. When the high power mode of the min-sum-algorithm is selected, the second hardware operates based on a scaled min-sum algorithm.

In some embodiments, the third hardware may be configured to use a third bit precision when the low power mode of the sum-product algorithm is selected. Alternatively, the third hardware may be configured to use a fourth bit precision when the high power mode of the sum-product algorithm is selected. The fourth bit precision may be higher than the third bit precision.

In some embodiments, the error correction decoder 100 may include a fourth hardware capable of performing the error correction decoding using the bit-flipping algorithm, the min-sum algorithm, and the sum-product algorithm. In addition, the fourth hardware may be configured to operate in the low power mode or the high power mode. When the fourth hardware is included in the error correction decoder 100, the first to third hardware may not be included in the error correction decoder 100.

In some embodiments, each of the first to fourth hardware is capable of generating messages that are propagated between the variable nodes and the check nodes and updating the values of the variable nodes and the values of the check nodes, and may be the node processor 120.

In some embodiments, the retraining component 400 may include the training component 320 shown in FIG. 2, and one or more operations of the training component 320 may be performed by the retraining component 400.

The retraining component 400 may retrain the artificial neural network 500 based on a result of the error correction decoding.

In some embodiments, when the first error correction decoding performed based on the first error correction decoding algorithm selected based on the number of primary UCNs and the artificial neural network 500 has failed, the retraining component 400 may retrain the artificial neural network 500.

In an example, the retraining component 400 may configure a retraining input vector that includes at least one of the number of primary UCNs, the number of UCNs corresponding to the iterations included in the first error correction decoding process, and the number of correction bits corresponding the iterations included in the first error correction decoding process. The retraining component 400 may retrain the trained artificial neural network 500 by labeling for the configured retraining input vector to be in the failure class. The retraining component 400 may set the label value corresponding to the fail class to '1' and input the retraining input vector to the input layer of the artificial neural network 500 to retrain the artificial neural network 500.

In some embodiments, when the first predicted value is equal to or greater than the second reference value and resulting in the first error correction decoding algorithm being selected, but the first error correction decoding using the first error correction decoding algorithm has failed, the retraining component 400 may retrain the artificial neural network 500. Herein, the second reference value may be a value greater than the first reference value.

In some embodiments, when the second error correction decoding performed using the second error correction decoding algorithm is selected based on the number of primary UCNs and the artificial neural network 500 is successful, the retraining component 400 may retrain the artificial neural network 500. Herein, the retraining component 400 may perform the retraining based on the number of iterations in which the second error correction decoding was successful.

For example, when the second error correction decoding is performed using the second error correction decoding algorithm selected based on the number of primary UCNs and the artificial neural network 500 is successful, the retraining component 400 may configure a retraining input vector that includes at least one of the number of primary UCNs, the number of UCNs respectively corresponding to the iterations included in the second error correction decoding process, and the number of correction bits respectively corresponding to the iterations included in the second error correction decoding process. The retraining component 400 may retrain the artificial neural network 500 by soft labeling the retraining input vector, which comprises setting a value of a label corresponding to a class to a real number in the range [0, 1]. For an example, when the output layer comprises both the output neuron corresponding to the success class and the output neuron corresponding to the failure class, the soft labeling includes setting each of label values to a real value in the range [0, 1] so that a sum of the label value of the output neuron corresponding to the success class and the label of the output neuron corresponding to the failure class is 1. For another example, when the output layer comprises only the output neuron corresponding to the success class, the soft labeling includes setting the label value of the output neuron corresponding to the success class to a real number greater than 0 and less than 1.

In some embodiments, when the number iterations in which the second error correction decoding is successful is equal to or less than a fourth reference value, the retraining component 400 may retrain the artificial neural network 500. In an example, the fourth reference value may be arbitrarily determined as long as the iteration index is less than the maximum number of the iterations.

In some embodiments, the retraining component 400 may set a higher label value for the success class when the number of iterations in which the second error correction decoding is successful is lower. For example, the retraining component 400 may set the label value for the success class to '0.8' when the number of iterations in which the second error correction decoding is successful is 3, and may set the label value for the success class to '0.7' when the number of iterations in which the second error correction decoding is successful is 5.

Figure 9:
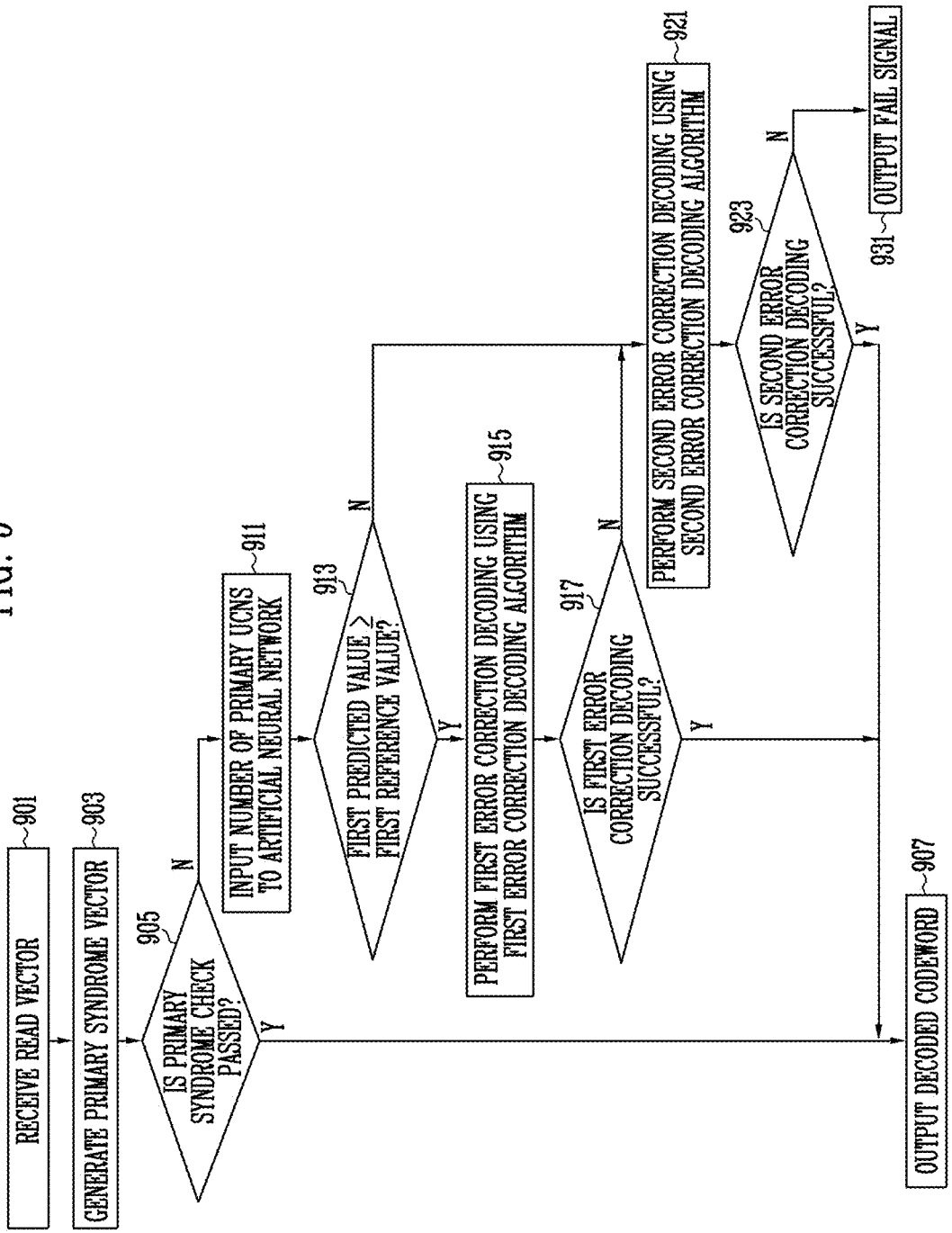
FIG. 9 is an example flowchart illustrating a method of operating the electronic device in accordance with an embodiment of the presently disclosed technology.

FIG. 9 is a flowchart illustrating an example method of operating the electronic device in accordance with an embodiment of the presently disclosed technology.

In step 901, the electronic device 30 may receive the read vector from the channel. For example, the read vector may be a result of reading the codeword stored in the memory device.

In step 903, the electronic device 30 may generate the primary syndrome vector. For example, the electronic device 30 may generate the primary syndrome vector based on the read vector and the parity check matrix of the error correction code.

In step 905, the electronic device 30 may determine whether the primary syndrome check has passed. For example, the primary syndrome check has passed when all entries in the primary syndrome vector are '0', and it has failed when at least one of the entries in the primary syndrome vector is non-zero.

When the primary syndrome check has passed (Y) as a result of the determination of step 905, in step 907, the decoded codeword may be output.

When the primary syndrome check has failed (N) as a result of the determination of step 905, in step 911, the electronic device 30 may input the number of primary UCNs corresponding to the primary syndrome vector to the artificial neural network 322. The artificial neural network 322 may be trained in advance based on the embodiments described with reference to FIGS. 1 to 7.

In step 913, the electronic device 30 may determine whether the first predicted value corresponding to the success class of the output of the artificial neural network 322 is equal to or greater than the first reference value. The output of artificial neural network 322 may be probability values to which a logistic regression is applied. The first reference value may be a predetermined value or the second predicted value corresponding to the failure class.

When the first predicted value is equal to or greater than the first reference value (Y) as a result of the determination of step 913, in step 915, the first error correction decoding operation may be performed using the first error correction decoding algorithm. At least one iteration may be performed as long as the iteration index is less than the maximum number of iterations during the first error correction decoding.

In step 917, the electronic device 30 may determine whether the first error correction decoding is successful. For example, the electronic device 30 may determine whether the syndrome check has passed in a predetermined iteration that is less than the maximum number of iterations.

When the first error correction decoding is successful (Y) as a result of the determination of step 917, in step 907, the decoded codeword may be output.

When the first predicted value is less than the first reference value (N) as a result of the determination of step 913 or when the first error correction decoding has failed (N) as a result of the determination of operation 917, in step 921, the second error correction decoding using the second error correction decoding algorithm may be performed. At least one iteration may be performed as long as an iteration index is less than the maximum number of iterations during the second error correction decoding.

In step 923, the electronic device 30 may determine whether the second error correction decoding is successful. For example, the error correction circuit 10 may determine whether the syndrome check has passed in a predetermined iteration that is less than the maximum number of iterations.

When the second error correction decoding is successful (Y) as a result of the determination of step 923, in step 907, the decoded codeword may be output.

When the second error correction decoding has failed (N) as a result of the determination of step 923, in step 931, a fail signal indicating that the second error correction decoding has failed may be output.

In some embodiments, in step 913, the power mode of the error correction decoding algorithm may be determined. For example, the high power mode of the first error correction decoding algorithm may be selected when the first predicted value is equal to or greater than the first reference value and less than the second reference value, whereas the low power mode of the first error correction decoding algorithm may be selected when the first predicted value is equal to or greater than the second reference value. For example, the low power mode of the second error correction decoding algorithm may be selected when the first predicted value is less than the first reference value and equal to or greater than the third reference value, and the high power mode of the second error correction decoding algorithm may be selected when the first predicted value is less than the third reference value.

In some embodiments, and not shown in FIG. 9, the electronic device 30 may retrain the artificial neural network 322 according to a result of at least one of the first error correction decoding and the second error correction decoding.

Figure 10:
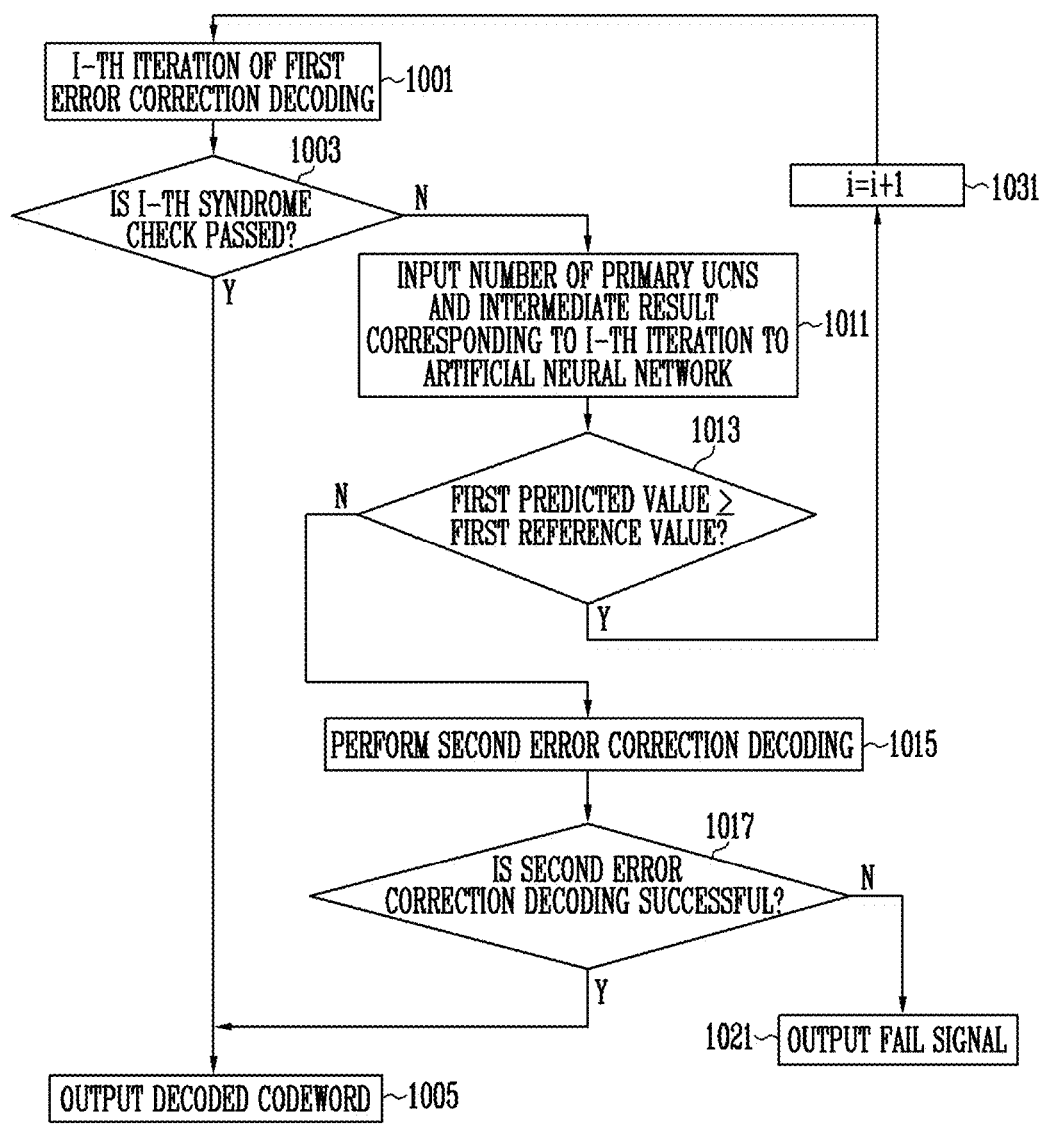
FIG. 10 is an example flowchart illustrating another method of operating the electronic device in accordance with an embodiment of the presently disclosed technology.

FIG. 10 is a flowchart illustrating another example method of operating the electronic device in accordance with an embodiment of the presently disclosed technology.

In step 1001, the electronic device 30 may perform the i-th iteration of the first error correction decoding.

In step 1003, the electronic device 30 may perform the syndrome check corresponding to the i-th iteration and determine whether the syndrome check corresponding to the i-th iteration has passed. For example, the syndrome check corresponding to the i-th iteration has passed when all the entries of the syndrome vector corresponding to the i-th iteration are '0', and otherwise, it may be determined that the syndrome check corresponding to the i-th iteration has failed.

When the syndrome check corresponding to the i-th iteration has passed (Y) as a result of the determination of operation 1003, in operation 1005, the decoded codeword may be output.

When the syndrome check corresponding to the i-th iteration has failed (N) as a result of the determination of operation 1003 (N), in step 1011, the electronic device 30 may input the number of primary UCNs and an intermediate result corresponding to the i-th iteration to the input layer of the trained artificial neural network. The intermediate result corresponding to the i-th iteration may include at least one of the number of UCNs corresponding to the i-th iteration and the number of correction bits corresponding to the i-th iteration.

In step 1013, the electronic device 30 may determine whether the first predicted value corresponding to the success class of the output of the artificial neural network 322 is equal to or greater than the first reference value. The output of artificial neural network 322 may be the probability values to which the logistic regression is applied. The first reference value may be a predetermined value or the second predicted value corresponding to the failure class.

When the first predicted value is equal to or greater than the first reference value (Y) as a result of the determination of step 1013, in step 1001, the i-th iteration may be performed, through step 1031.

When the first predicted value is less than the first reference value (N) as a result of the determination of step 1013, in step 1015, the second error correction decoding may be performed. The second error correction decoding may be performed based on the LLR vector corresponding to the read vector. When the second error correction decoding is performed, a new iteration may be performed.

In step 1017, the electronic device 30 may determine whether the second error correction decoding is successful as long as an iteration index is less than the maximum number of iterations of the second error correction decoding. For example, the error correction circuit 10 may determine whether the syndrome check has passed in a predetermined iteration that is less than the maximum number of iterations.

When the second error correction decoding is successful (Y) as a result of the determination of step 1017, in step 1005, the decoded codeword may be output.

When the second error correction decoding has failed as a result of the determination of step 1017, in step 1021, the failure signal indicating that the second error correction decoding has failed may be output.

FIG. 10 illustrates an example in which the number of primary UCNs and the intermediate result corresponding to the i-th iteration are input to the artificial neural network in each iteration. However, the number of primary UCNs and the intermediate result corresponding to the i-th iteration may be input to the artificial neural network only in a specific situation. For example, and as described above, the number of primary UCNs and the intermediate result corresponding to the i-th iteration may be input to the artificial neural network only in the iteration satisfying at least one of a case where the number of UCNs corresponding to the i-th iteration exceeds the third threshold value and a case where the number of correction bits corresponding to the i-th iteration is less than the fourth threshold value. When the intermediate result corresponding to the i-th iteration does not satisfy the above-described specific situation, operations 1011 and 1013 may be omitted in the corresponding i-th iteration. In this case, in step 1003, when the syndrome check corresponding to the i-th iteration has failed (N), step 1001 through operation 1031 may be performed.

Figure 11:
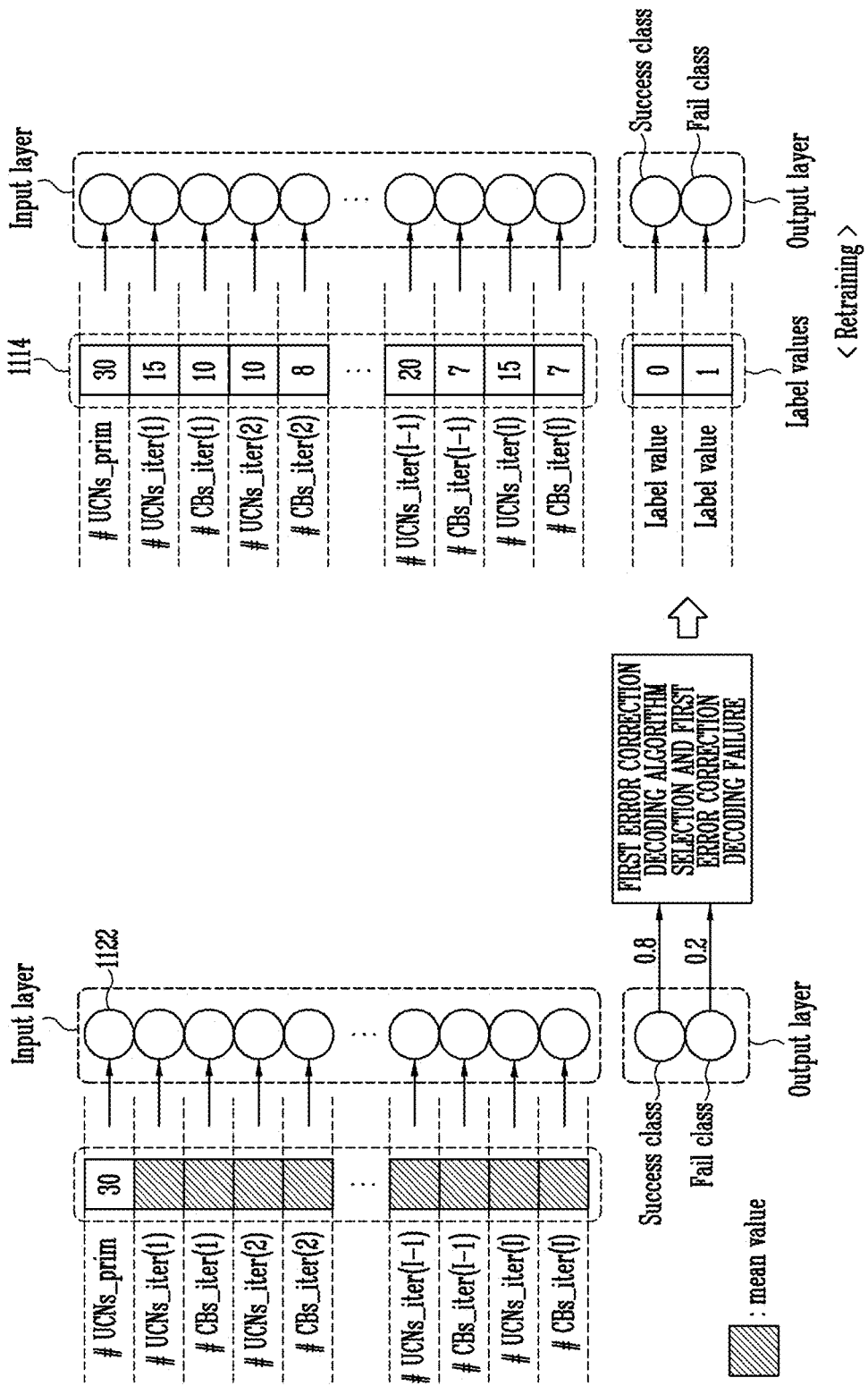
FIG. 11 is an example diagram illustrating a method of retraining the artificial neural network in accordance with an embodiment of the presently disclosed technology.

FIG. 11 is an example diagram illustrating a method of retraining the artificial neural network in accordance with an embodiment of the presently disclosed technology.

When the first error correction decoding is selected based on the output of the artificial neural network 322 but the first error correction decoding has failed, then the electronic device 30 may retrain the artificial neural network 322.

FIG. 11 shows a case where the number of primary UCNs (#UCNs_prim) corresponding to the read vector is input to input neurons 1122 that are present in the input layer of the artificial neural network 322. Herein, the average value of the training input vectors used in the training of the artificial neural network 322 may be input to other input neurons present in the input layer.

When the first predicted value 0.8 corresponding to the success class of the output of the artificial neural network 322 is greater than the second predicted value 0.2 corresponding to the failure class, the first error correction decoding algorithm may be selected, and the first error correction decoding on the read vector may be performed using the first error correction decoding algorithm.

When the first error correction decoding has failed, a retraining input vector 1114 may be configured. The retraining input vector 1114 may include at least one of the number of primary UCNs (#UCNs_prim), the number of UCNs corresponding to the i-th iteration (#UCNs_iter(i)), and the number of correction bits corresponding to the i-th iteration (#CBs_iter(i)). Herein, the retraining input vector 1114 may be labeled as the failure class. Therefore, the label value corresponding to the success class may be set to '0', and the label value corresponding to the failure class may be set to '1'.

The artificial neural network may be retrained based on the retraining input vector 1114 and the label values.

Figure 12:
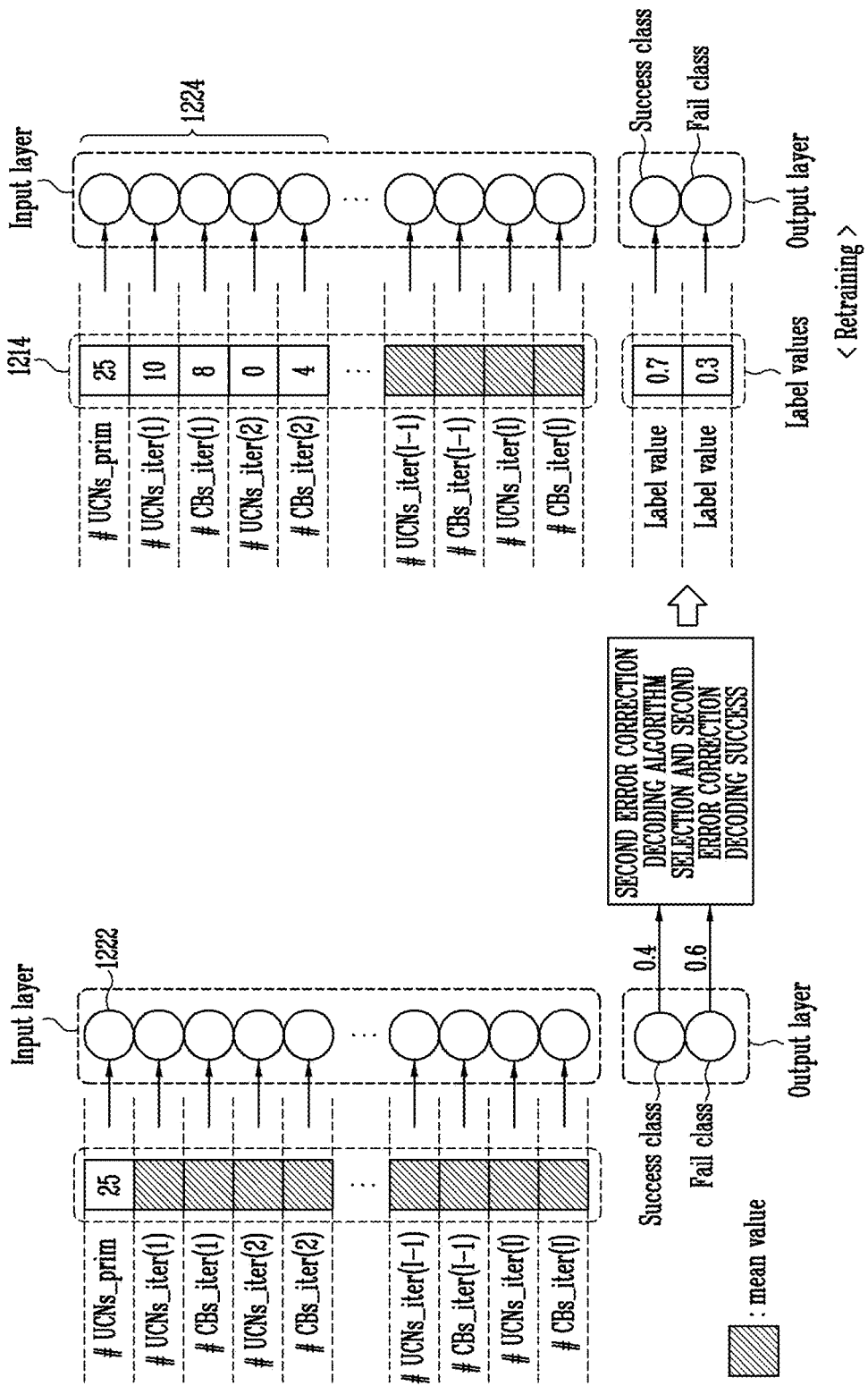
FIG. 12 is an example diagram illustrating another method of retraining the artificial neural network in accordance with an embodiment of the presently disclosed technology.

FIG. 12 is an example diagram illustrating another method of retraining the artificial neural network in accordance with an embodiment of the presently disclosed technology.

When the second error correction decoding is selected based on the output of the artificial neural network 322 and the second error correction decoding is successful, the electronic device 30 may retrain the artificial neural network 322.

FIG. 12 shows a case where the number of primary UCNs (#UCNs_prim) corresponding to the read vector is input to input neurons 1222 that are present in the input layer of the artificial neural network 322. Herein, the average value of the training input vectors used in the training of the artificial neural network 322 may be input to the other input neurons present in the input layer.

When the first predicted value 0.4 corresponding to the success class of the output of the artificial neural network 322 is less than the second predicted value 0.6 corresponding to the failure class, the second error correction decoding algorithm may be selected, and the second error correction decoding on the read vector may be performed using the second error correction decoding algorithm.

When the second error correction decoding is successful in the i-th iteration of the second error correction decoding, a retraining input vector 1214 may be configured. The retraining input vector 1214 may include at least one of the number of primary UCNs (#UCNs_prim), the number of UCNs corresponding to the i-th iteration (#UCNs_iter(i)), and the number of correction bits corresponding to the i-th iteration (#CBs_iter(i)).

In some embodiments, the retraining input vector 1214 may be input to 2i+1 input neurons 1224 of the input layer of the artificial neural network 322. The average value of the training input vectors used in the training of the artificial neural network 322 may be input to the remaining input neurons of the input layer of the artificial neural network 322.

In some embodiments, the retraining input vector 1214 may be soft labeled as being part of the success class. FIG. 12 shows an example in which the label value corresponding to the success class is set to '0.7' and the label value corresponding to the failure class is set to '0.3'.

In some embodiments, the artificial neural network may be retrained based on the retraining input vector 1214 and the label values.

Figures 13, 14:
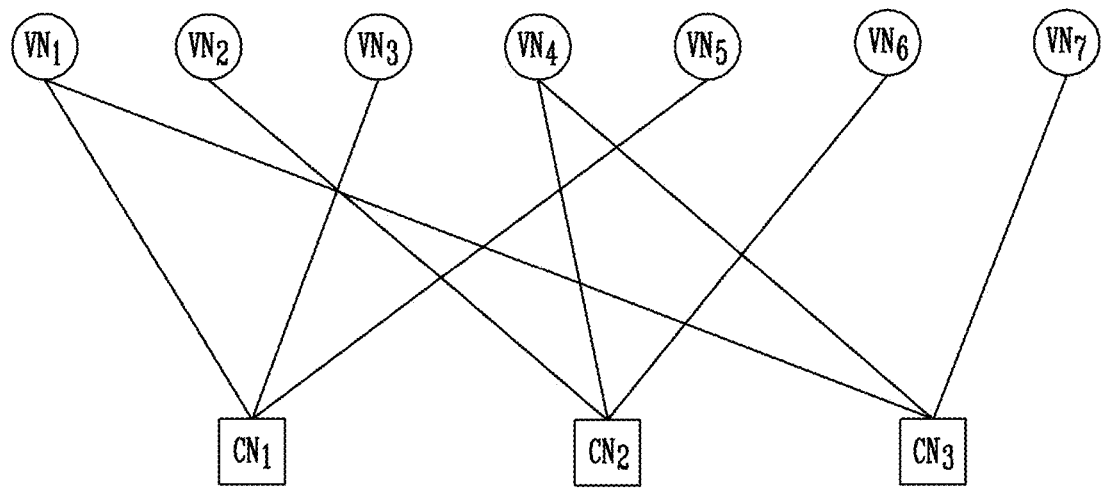
FIG. 13 is an example diagram illustrating a parity check matrix.
FIG. 14 is an example diagram illustrating the parity check matrix shown in FIG. 13 by a Tanner graph.

FIG. 13 is an example diagram illustrating a parity check matrix.

An (N, K) code may be represented as a parity check matrix having a size of M×N. Herein, K represents a length of the original data, M represents the number of parities bits, and (M=N−K) is satisfied. Each entry of the parity check matrix may be '0' or '1'. When the number of '1' entries in the parity check matrix is relatively smaller than the number of '0' entries, the (N, K) code may be referred to as an (N, K) LDPC code. Herein, N and K may be natural numbers. FIG. 13 shows an example of a parity check matrix H of a (7, 4) code.

A matrix in which each element is a sub matrix is referred to as a base matrix. Each element of the base matrix may be a sub matrix of size z×z. Herein, z may be an integer equal to or greater than 2. For an example, in a base matrix of a binary LDPC code, '0' may indicate that the entry is a zero matrix, and '1' may indicate that the entry is a non-zero matrix. For another example, in a base matrix of quasi-cyclic (QC)-LDPC code, '1' may indicate that the corresponding entry is a cyclic permutation matrix, which is a matrix that is obtained by cyclically shifting an identity matrix by a predetermined shift value, wherein any one cyclic permutation matrix may have a shift value different from that of another cyclic permutation matrix.

FIG. 14 is an example diagram illustrating the parity check matrix shown in FIG. 13 as a Tanner graph.

The (N, K) code may be represented as a Tanner graph, which is an equivalent bipartite graph expression. The Tanner graph may be expressed by N-K check nodes, N variable nodes, and edges. The check nodes correspond to rows of the parity check matrix, and the variable nodes correspond to columns of the parity check matrix. Each edge connects one check node and one variable node and represents a '1' entry in the parity check matrix.

The parity check matrix of the (7, 4) code shown in FIG. 13 may be expressed by a Tanner graph that includes three check nodes CN1 to CN3 and seven variable nodes VN1 to VN7, as shown in FIG. 14. A solid line connecting the check nodes CN1 to CN3 and the variable nodes VN1 to VN7 represents an edge.

In some embodiments, iterative decoding may be performed through the repeated exchange of messages between the check nodes CN1 to CN3 and the variable nodes VN1 to VN7.

Figures 15, 16:
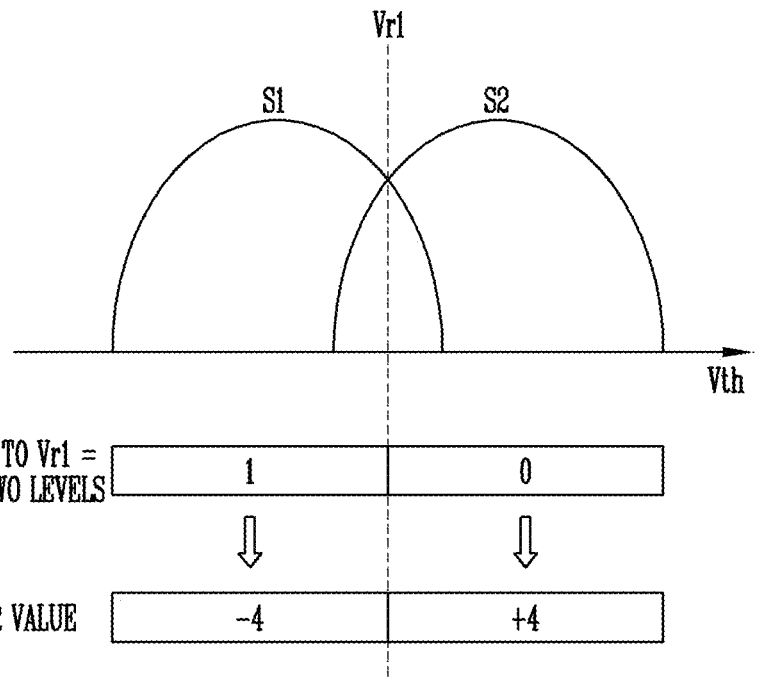
FIG. 15 is an example diagram illustrating a syndrome vector calculated using the parity check matrix shown in FIG. 13.
FIG. 16 is an example diagram illustrating a process of generating an initial log-likelihood ratio (LLR) value using one read value during hard decision decoding.

FIG. 15 is an example diagram illustrating a syndrome vector calculation using the parity check matrix shown in FIG. 13.

As described above, the syndrome vector Si may be generated based on the parity check matrix H and the transposition $Ci^T$ of the hard decision vector Ci corresponding to the i-th iteration. Entries Ci1, Ci2, Ci3, . . . , and Ci7 of the hard decision vector Ci represent hard decision values of the variable nodes corresponding to the i-th iteration. Entries Si1, Si2, and Si3 of the syndrome vector Si correspond to the check nodes CN1, CN2, and CN3 on the Tanner graph shown in FIG. 14, respectively.

In the context of FIG. 15, the syndrome check has passed when all the entries Si1, Si2, and Si3 of the syndrome vector Si are '0', which corresponds to the error correction decoding being successful in that iteration. This results in the completion of the iterative decoding operation, and the hard decision vector Ci corresponding to the i-th iteration may be output as the decoded codeword.

However, if at least one of the entries Si1, Si2, and Si3 of the syndrome vector Si is not '0', the syndrome check has failed. This corresponds to the error correction decoding being unsuccessful in that iteration, and a next iteration is performed as long as the maximum number of iterations I has not been reached.

FIG. 16 is an example diagram illustrating the generation of the initial LLR value using one read value during hard decision decoding.

FIG. 16 shows a threshold voltage distribution Vth of memory cells each having any one of a first state S1 and a second state S2.

In order to obtain one read vector corresponding to one codeword, one read voltage may be applied to a plurality of memory cells.

For example, when a first read voltage Vr1 is applied to the plurality of memory cells, a read value for a memory cell having a threshold voltage lower than the first read voltage Vr1 may be represented as '1', and a read value for a memory cell having a threshold voltage higher than the first read voltage Vr1 may be represented as '0'. As shown in FIG. 16, when one read voltage (e.g., the first read voltage Vr1) is used, one read value may be obtained for each one memory cell.

In some embodiments, the electronic device 30 may determine the first read value corresponding to the first read voltage Vr1 as the read value that has been quantized to two levels.

The electronic device 30 may convert the read value quantized to two levels into the initial LLR value. The conversion to the initial LLR value may be performed by referring to a predetermined lookup table.

Figure 17:
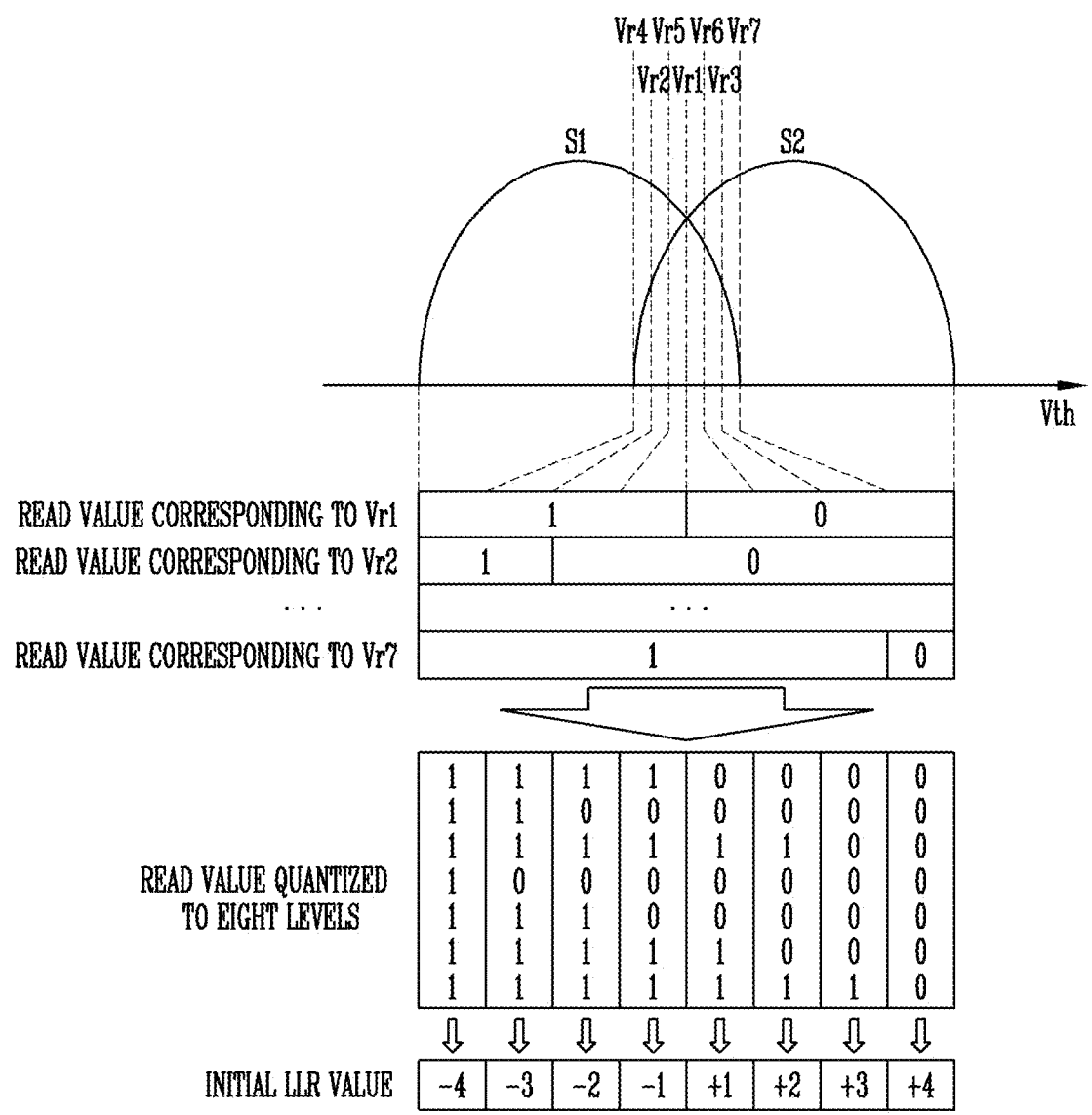
FIG. 17 is an example diagram illustrating a process of generating the initial LLR value using multiple read values during soft decision decoding.

FIG. 17 is an example diagram illustrating the generation of the initial LLR value using multiple read values during soft decision decoding.

FIG. 17 shows a distribution of the threshold voltages Vth of the memory cells each having any one of the first state S1 and the second state S2.

When a quantization level of g+1 is used (e.g., g=7 in FIG. 17), each of the g read voltages may be sequentially applied to the plurality of memory cells in order to obtain g read vectors corresponding to one codeword.

For example, when a quantization level of 2 is used, one read voltage Vr1 may be applied to the plurality of memory cells, and when a quantization level of 3 is used, two read voltages Vr1 and Vr2 may be sequentially applied to the plurality of memory cells. Similarly, when a quantization level of 8 is used, seven read voltages Vr1, Vr2, Vr3, Vr4, Vr5, Vr6, and Vr7 may be sequentially applied to the plurality of memory cells. More generally, when a quantization level of g+1 is used, g read values may be obtained for each memory cell.

When any one of the g read voltages is applied to the plurality of memory cells, the read value for the memory cell having a threshold voltage lower than the applied read voltage may be represented as '1', and the read value for a memory cell having a threshold voltage higher than the applied read voltage may be represented as '0'.

The electronic device 30 may combine the g read values corresponding to the g read voltages with each other to generate a read value quantized to g+1 levels. For example, as shown in FIG. 17, when the seven read voltages Vr1, Vr2, Vr3, Vr4, Vr5, Vr6, and Vr7 are used, the electronic device 30 may combine the read values corresponding to the seven read voltages with each other to generate a read value quantized to eight levels.

The electronic device 30 may convert the read value quantized to g+1 levels into the initial LLR value. The conversion to the initial LLR value may be performed by referring to the predetermined lookup table.

Figures 18, 19:
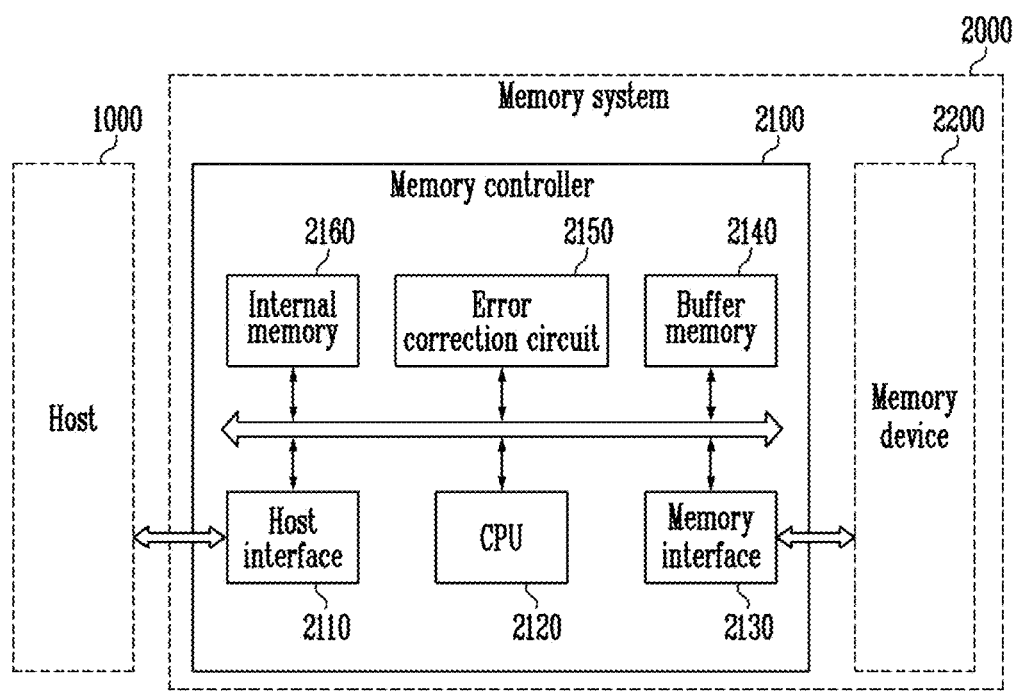
FIG. 18 is an example diagram illustrating a lookup table.
FIG. 19 is an example diagram illustrating a memory system in accordance with an embodiment of the presently disclosed technology.

FIG. 18 is an example diagram illustrating a lookup table.

As shown in FIG. 18, the lookup table may define LLR values corresponding to a plurality of quantization levels.

The electronic device 30 may convert each of the read values quantized to g+1 levels into any one of g+1 LLRs corresponding to the quantization level of g+1 with reference to the lookup table.

For example, when a quantization level of 2 is used, the electronic device 30 may convert any one of the read values quantized to two levels into an LLR1 value and convert the other of the read values into an LLR2 value. For example, '1' among the read values quantized to two levels may be converted into an LLR1 value of '−4', and '0' may be converted into an LLR2 value of '+4'.

In the present document, the read value, the read values, or the read vector refers to a read value, read values, or a read vector quantized to g+1 levels.

FIG. 19 is an example diagram illustrating a memory system in accordance with an embodiment of the presently disclosed technology.

As shown therein, the memory system 2000 may include a memory device 2200 in which data is stored and a memory controller 2100 that controls the memory device 2200 according to a request of a host 1000.

In some embodiments, the host 1000 may be a device or a system that stores data in the memory system 2000 or retrieves data from the memory system 2000. For example, the host 1000 may include at least one of a computer, a portable digital device, a tablet, a digital camera, a digital audio player, a television, a wireless communication device, or a cellular phone, but embodiments of the present disclosure are not limited thereto.

The memory controller 2100 may control overall operations of the memory system 2000. The memory controller 2100 may perform various operations according to a request from the host 1000. The memory controller 2100 may perform at least one of a program operation for storing data in the memory device 2200, a read operation for reading data stored in the memory device 2200, and an erase operation for erasing the data stored in the memory device 2200.

In some embodiments, the memory controller 2100 may include a host interface 2110, a central processing unit 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the central processing unit 2120.

The host interface 2110 may communicate with the host 1000 using various interface protocols. For example, the host interface 2110 may communicate with the host 1000 using an interface selected from a non-volatile memory express (NVMe), a peripheral component interconnect-express (PCI-E), an advanced technology attachment (ATA), a serial ATA (SATA), a parallel ATA (PATA), a universal serial bus (USB), a multi-media card (MMC), an enhanced small disk interface (ESDI), integrated drive electronics (IDE), a mobile industry processor interface (MIPI), a universal flash storage (UFS), a small computer system interface (SCSI), or a serial attached SCSI (SAS), but embodiments of the present disclosure are not limited thereto.

In some embodiments, the central processing unit 2120 may perform various operations or generate a command and an addresses to control the memory device 2200. For example, the central processing unit 2120 may generate various commands and addresses necessary for the program operation, the read operation, the erase operation, and the like, according to the request received from the host 1000, and transmit the commands and the addresses to the memory device 2200.

The central processing unit 2120 may convert a logical address included in the request received from the host 1000 into a physical address in order to control an operation of the memory device 2200. The central processing unit 2120 may convert the logical address into the physical address or convert the physical address into the logical address using an address mapping table stored in the internal memory 2160. The central processing unit 2120 may update the address mapping table when new data is programmed in the memory device 2200 or data stored in the memory device 2200 is erased.

The central processing unit 2120 may randomize data during the program operation and de-randomize the data during the read operation.

In some embodiments, the memory interface 2130 may communicate with the memory device 2200 using various interface protocols.

In some embodiments, the buffer memory 2140 may temporarily store data while the memory controller 2100 controls the memory device 2200. For example, program data received from the host 1000 may be temporarily stored in the buffer memory 2140 until the program operation is completed. In addition, during the read operation, data read from the memory device 2200 may be temporarily stored in the buffer memory 2140.

In some embodiments, the error correction circuit 2150 may perform error correction encoding on the program data and error correction decoding on the read data. The error correction circuit 2150 may be characterized by a certain level of error correction capability. For example, the error correction circuit 2150 may detect and correct an error included in the read data when the number of bit errors present in the read data does not exceed the error correction capability. The maximum number of error bits that does not exceed the error correction capability of the error correction circuit 2150 is referred to as a maximum number of permissible error bits. When a number of error bits in the read data exceeds the maximum number of permissible error bits, the error correction decoding may fail.

The error correction circuit 2150 may perform the error correction decoding according to the error correction decoding algorithm selected using the artificial neural network. The error correction circuit 2150 may retrain the artificial neural network using the result of the error correction decoding.

The error correction circuit 2150 may be the error correction circuit 10 described with reference to FIG. 8.

In some embodiments, the internal memory 2160 may be used as a storage that stores various pieces of information required for an operation of the memory controller 2100. The internal memory 2160 may store a plurality of tables. For example, the internal memory 2160 may store an address mapping table in which logical address and the physical address are mapped.

In some embodiments, the memory device 2200 may be configured as a volatile memory device in which stored data is lost when power supply is cut off, or as a non-volatile memory device in which stored data is maintained even when the power supply is cut off. The memory device 2200 may perform the program operation, the read operation, the erase operation, and the like according to control of the memory controller 2100.

The memory device 2200 may include at least one storage area for storing data. The storage area may correspond to one page that includes a plurality of memory cells, one memory block that includes a plurality of pages, one plane that includes a plurality of memory blocks, or one die that includes a plurality of pages. However, embodiments of the present disclosure are not limited thereto.

Figure 20:
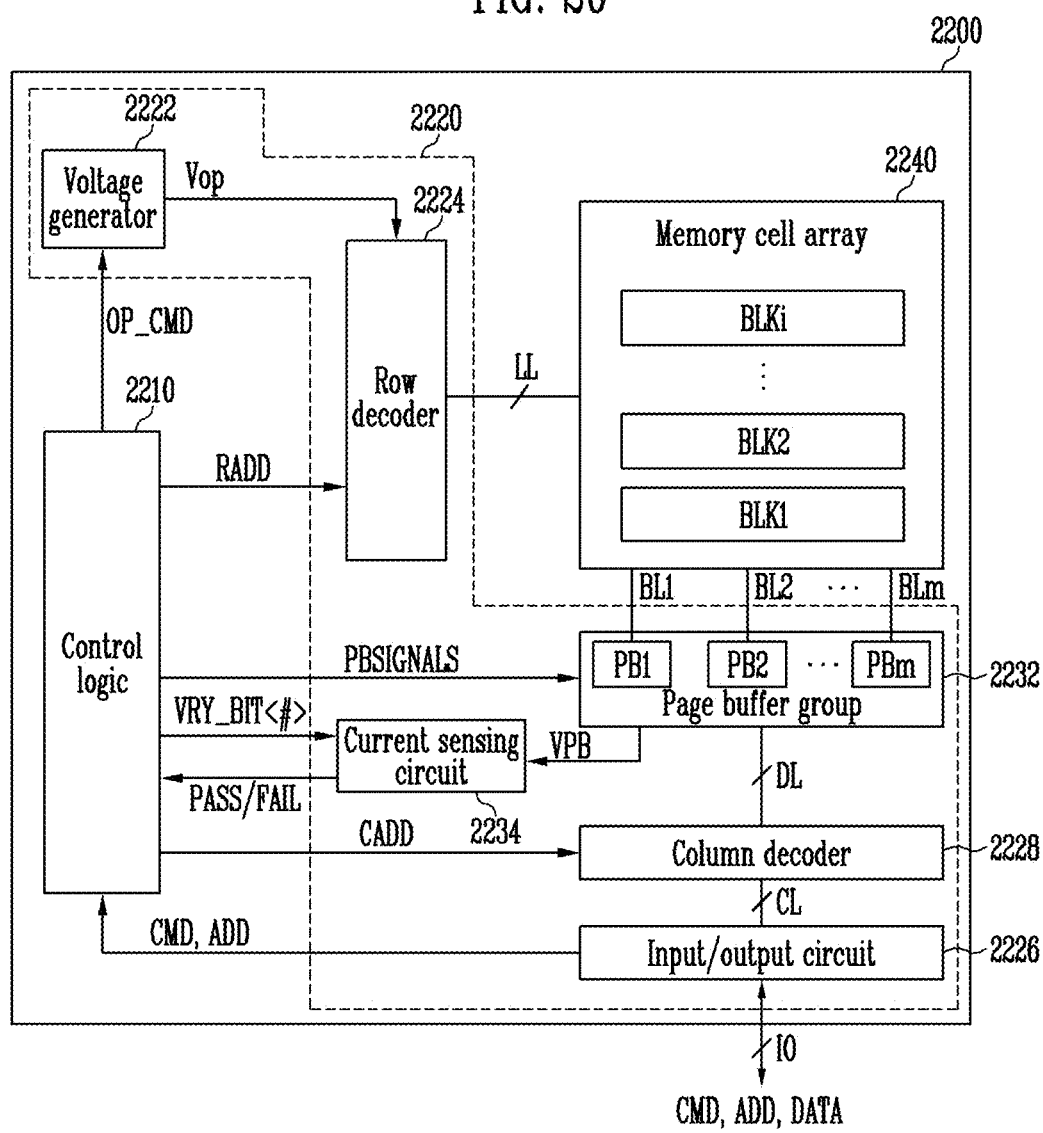
FIG. 20 is an example diagram illustrating another memory device in accordance with an embodiment of the presently disclosed technology.

FIG. 20 is an example diagram illustrating the memory device in accordance with an embodiment of the presently disclosed technology.

In some embodiments, the memory device 2200 may include a control logic 2210, peripheral circuits 2220, and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100, as shown in FIG. 19.

The control logic 2210 may control the peripheral circuits 2220 in response to the command CMD and the address ADD received from the memory controller 2100 through the input/output circuit 2226. For example, the control logic 2210 may output an operation signal OP_CMD, a row address RADD, a column address CADD, page buffer control signals PBSIGNALS and a permission bit VRY_BIT<#> in response to the command CMD and the address ADD. The control logic 2210 may determine whether a verify operation has passed or failed in response to a pass signal PASS or a fail signal FAIL received from the current sensing circuit 2234.

The peripheral circuits 2220 may perform a program operation for storing data in the memory cell array 2240, a read operation for outputting data stored in the memory cell array 2240, and an erase operation for erasing the data stored in the memory cell array 2240.

The voltage generation circuit 2222 may generate various operation voltages Vop used for the program operation, the read operation, and the erase operation in response to the operation signal OP_CMD received from the control logic 2210. For example, the voltage generation circuit 2222 may transfer a program voltage, a verify voltage, a pass voltage, a read voltage, an erase voltage, a turn-on voltage, and the like to the row decoder 2224.

The row decoder 2224 may transfer the operation voltages Vop to local lines LL connected to a selected memory block among memory blocks included in the memory cell array 2240 in response to the row address RADD received from the control logic 2210. The local lines LL may include local word lines, local drain select lines, and local source select lines. In addition, the local lines LL may include various lines connected to a memory block such as a source line.

The input/output circuit 2226 may transfer the command CMD and the address ADD received from the memory controller through input/output lines IO to the control logic 2210 or exchange data DATA with the column decoder 2228.

The column decoder 2228 may transfer data between the input/output circuit 2226 and the page buffer group 2232 in response to the column address CADD received from the control logic 2210. For example, the column decoder 2228 may exchange data with page buffers PB1 to PBm through data lines DL, or exchange data with the input/output circuit 2226 through the column lines CL.

The page buffer group 2232 may be connected to bit lines BL1 to BLm commonly connected to memory blocks BLK1 to BLKi. The page buffer group 2232 may include a plurality of page buffers PB1 to PBm connected to the bit lines BL1 to BLm. For example, one page buffer may be connected to each bit line. The page buffers PB1 to PBm may operate in response to the page buffer control signals PBSIGNALS received from the control logic 2210. For example, during the program operation, the page buffers PB1 to PBm may temporarily store program data received from the memory controller and adjust a voltage applied to the bit lines BL1 to BLm according to the program data. In addition, during the read operation, the page buffers PB1 to PBm may temporarily store data received through the bit lines BL1 to BLm or may sense a voltage or a current of the bit lines BL1 to BLm.

During the read operation or the verify operation, the current sensing circuit 2234 may generate a reference current in response to the permission bit VRY_BIT<#> received from the control logic 2210, and compare a reference voltage generated by a reference current with a sensing voltage VPB received from the page buffer group 2232 to output the pass signal PASS or the fail signal FAIL.

The memory cell array 2240 may include a plurality of memory blocks BLK1 to BLKi in which data is stored. The memory blocks BLK1 to BLKi may store user data and various pieces of information necessary for the operation of the memory device 2200. The memory blocks BLK1 to BLKi may be implemented in a two-dimensional structure or a three-dimensional structure, and may be configured identically to each other.

Figure 21:
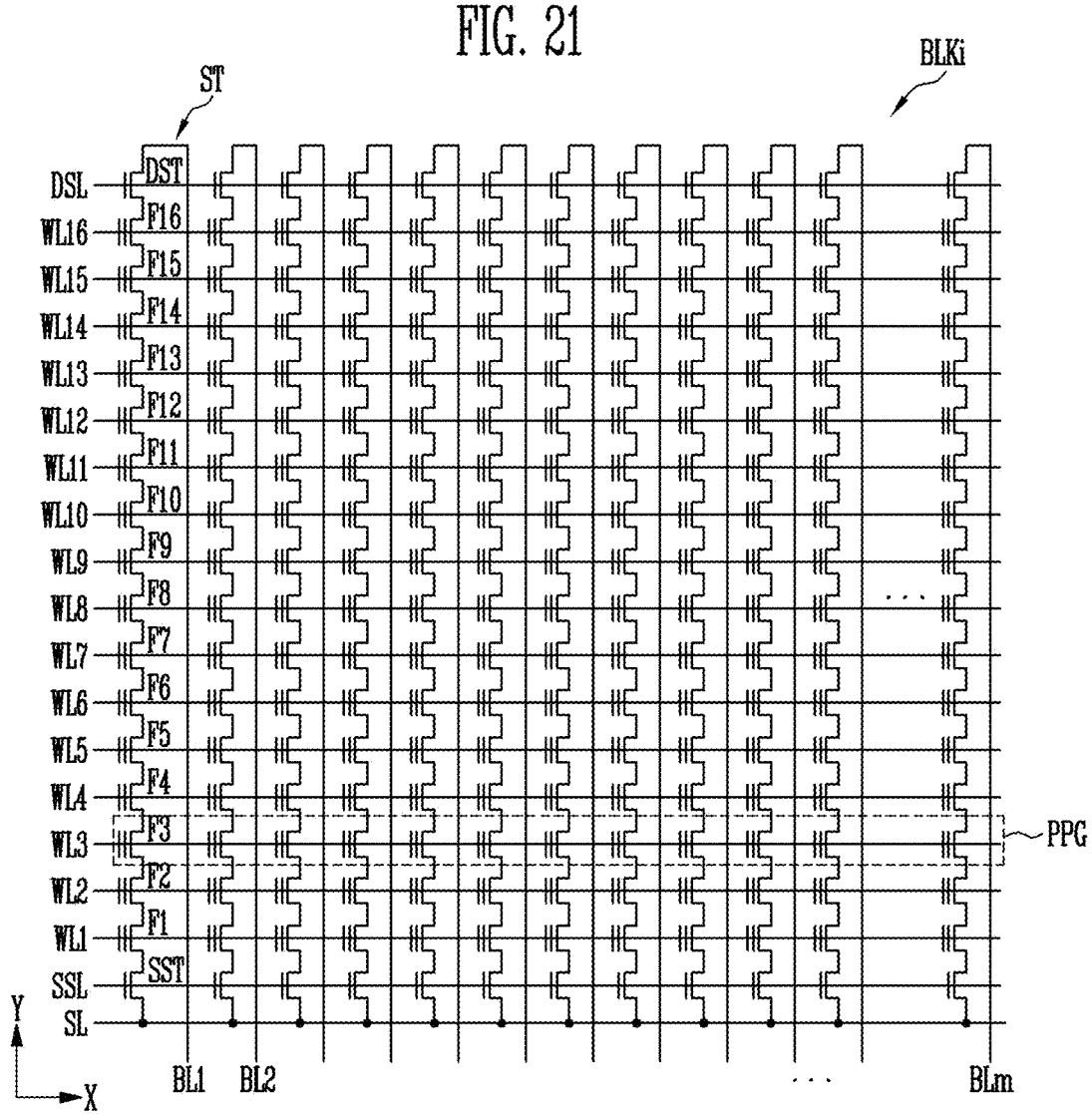
FIG. 21 is an example diagram illustrating a memory block.

FIG. 21 is an example diagram illustrating a memory block.

The memory cell array may include a plurality of memory blocks, each of which may be a shown in FIG. 21.

As shown in FIG. 21, a plurality of word lines are arranged parallel to each other between a first select line and a second select line, and may be connected to the memory block BLKi. Herein, the first select line may be a source select line SSL, and the second select line may be a drain select line DSL. Specifically, the memory block BLKi may include a plurality of strings ST connected between the bit lines BL1 to BLm and a source line SL. The bit lines BL1 to BLm may be connected to the strings ST, respectively, and the source line SL may be commonly connected to the strings ST. Since the strings ST may be configured identically to each other, the string ST connected to the first bit line BL1 is described as an example.

The string ST may include a source select transistor SST, a plurality of memory cells F1 to F16, and a drain select transistor DST connected in series between the source line SL and the first bit line BL1. One string ST may include at least one source select transistor SST and at least one drain select transistor DST, and may include a greater number of memory cells than shown in FIG. 21.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of the source select transistors SST included in different strings ST may be connected to the source select line SSL, gates of the drain select transistors DST may be connected to the drain select line DSL, and gates of the memory cells F1 to F16 may be connected to a plurality of word lines WL1 to WL16. A group of memory cells connected to the same word line among memory cells included in different strings ST may be referred to as a physical page PPG. Therefore, the memory block BLKi may include as many physical pages PPG as the number of word lines WL1 to WL16.

Figure 22:
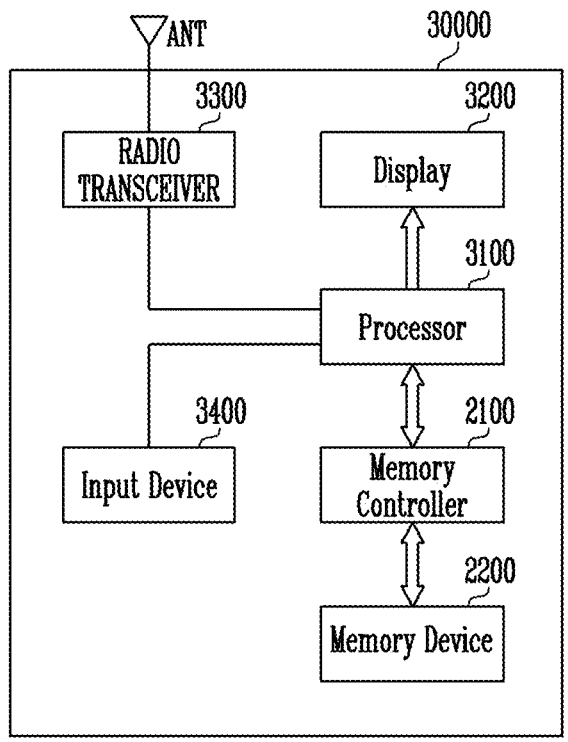
FIG. 22 is an example diagram illustrating a memory system including the memory controller shown in FIG. 19.

FIG. 22 is an example diagram illustrating another example of the memory system that includes the memory controller shown in FIG. 19.

As shown in FIG. 22, the memory system 30000 may be implemented as a cellular phone, a smart phone, a tablet, a personal computer (PC), a personal digital assistant (PDA), or a wireless communication device. The memory system 30000 may include the memory device 2200 and the memory controller 2100 capable of controlling the operation of the memory device 2200.

The memory controller 2100 may control a data access operation, for example, a program operation, an erase operation, a read operation, or the like, of the memory device 2200 under control of a processor 3100.

Data programmed in the memory device 2200 may be output through a display 3200 under the control of the memory controller 2100.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 2100 or the display 3200. The memory controller 2100 may transmit the signal processed by the processor 3100 to the memory device 2200. In addition, the radio transceiver 3300 may convert a signal output from the processor 3100 into a radio signal, and output the converted radio signal to an external device through the antenna ANT.

An input device 3400 may be a device capable of inputting a control signal for controlling the operation of the processor 3100 or data to be processed by the processor 3100. The input device 3400 may be implemented as a pointing device such as a touch pad or a computer mouse, a keypad, a keyboard, or an image sensor.

The processor 3100 may control an operation of the display 3200 so that data output from the memory controller 2100, data output from the radio transceiver 3300, or data output from the input device 3400 is output through the display 3200.

In some embodiments, the memory controller 2100 capable of controlling the operation of memory device 2200 may be implemented as a part of the processor 3100, or may be implemented as a chip separate from the processor 3100.

Figure 23:
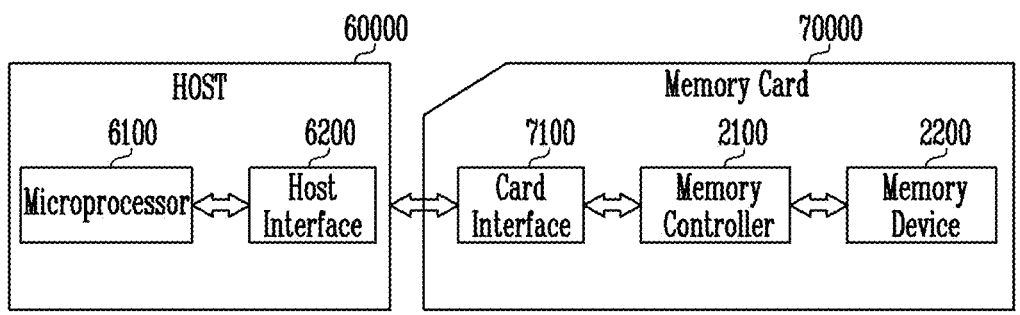
FIG. 23 is an example diagram illustrating another memory system including the memory controller shown in FIG. 19.

FIG. 23 is an example diagram illustrating another example of the memory system that includes the memory controller shown in FIG. 19.

As shown in FIG. 23, the memory system 70000 may be implemented as a memory card or a smart card. The memory system 70000 may include the memory device 2200, the memory controller 2100, and a card interface 7100.

The memory controller 2100 may control data exchange between the memory device 2200 and the card interface 7100. In some embodiments, the card interface 7100 may be a secure digital (SD) card interface or a multi-media card (MMC) interface, but is not limited thereto.

The card interface 7100 may interface data exchange between a host 60000 and the memory controller 2100 based on a protocol of the host 60000. In some embodiments, the card interface 7100 may support a universal serial bus (USB) protocol, and an interchip (IC)-USB protocol. Herein, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet, a digital camera, a digital audio player, a mobile phone, a console video game hardware, or a digital set-top box, the host interface 6200 may perform data communication with the memory device 2200 through the card interface 7100 and the memory controller 2100 under control of a microprocessor 6100.

What is claimed is:
1. An electronic device comprising:
   a decoding controller configured to
      transmit, to a trained artificial neural network, a first input comprising at least one of a number of primary unsatisfied check nodes (UCNs), a number of UCNs corresponding to at least one iteration, and a number of correction bits corresponding to the at least one iteration, and
      select, based on an output of the trained artificial neural network corresponding to the first input, either a first error correction decoding algorithm or a second error correction decoding algorithm; and
   an error correction decoder configured to perform an error correction decoding operation on a read vector using the selected error correction decoding algorithm,
   wherein the output of the trained artificial neural network includes a first predicted value indicative of a probability that the first error correction decoding operation using a first error correction decoding algorithm is successful.

2. The electronic device of claim 1, wherein the number of primary UCNs is calculated based on the read vector and a parity check matrix.

3. The electronic device of claim 2, wherein the selected error correction decoding algorithm is the first error correction decoding algorithm,
   wherein the decoding controller transmits, to the trained artificial neural network, a second input comprising at least one of the number of UCNs corresponding to an i-th iteration of the error correction decoding operation and the number of correction bits corresponding to the i-th iteration,
   wherein i is a natural number,
   wherein the decoding controller is further configured to determine whether to perform, based on an output of the trained artificial neural network corresponding to the second input, a second error correction decoding operation using the second error correction decoding algorithm, and
   wherein the error correction decoder ends the first error correction decoding operation and performs the second error correction decoding operation based on the determination of the decoding controller.

4. The electronic device of claim 3, wherein the decoding controller determines whether to transmit the second input to the trained artificial neural network based on the second input.

5. The electronic device of claim 4, wherein the decoding controller transmits the second input to the trained artificial neural network based on whether the number of correction bits corresponding to the i-th iteration is less than a second threshold value.

6. The electronic device of claim 4, wherein the decoding controller transmits the second input to the trained artificial neural network based on whether the number of UCNs corresponding to the i-th iteration exceeds a first threshold value.

7. The electronic device of claim 1, wherein the first error correction decoding algorithm is a bit-flipping algorithm, and wherein the second error correction decoding algorithm is a min-sum algorithm or a sum-product algorithm.

8. The electronic device of claim 1, wherein the first predicted value is a probability value to which logistic regression is applied.

9. The electronic device of claim 1, wherein the first error correction decoding algorithm is selected upon a determination that the first predicted value of the output of the trained artificial neural network corresponding to the first input is equal to or greater than a first reference value, and wherein the second error correction decoding algorithm is selected upon a determination that the first predicted value is less than the first reference value.

10. The electronic device of claim 9, wherein the output of the trained artificial neural network further includes a second predicted value indicative of a probability that the first error correction decoding operation has failed, and wherein the first reference value is the second predicted value.

11. The electronic device of claim 9, wherein the decoding controller is further configured to select, based on the output of the trained artificial neural network corresponding to the first input, a power mode to be applied to the selected error correction decoding algorithm, wherein the power mode includes either a low power mode and a high power mode, and wherein the error correction decoder performs the error correction decoding operation by applying the selected power mode to the selected error correction decoding algorithm.

12. The electronic device of claim 11, wherein the decoding controller is configured to:
select the high power mode upon a determination that the first predicted value is equal to or greater than the first reference value and less than a second reference value, the second reference value being greater than the first reference value, and
select the low power mode upon a determination that the first predicted value is equal to or greater than the second reference value.

13. The electronic device of claim 11, wherein applying the high power mode comprises using an unreliability value of each variable node compared to the low power mode.

14. The electronic device of claim 11, wherein applying the high power mode comprises using a higher bit precision compared to a bit precision used in the low power mode.

15. The electronic device of claim 1, further comprising:
a retraining component configured to retrain the trained artificial neural network by labeling a retraining input vector,
wherein the retraining input vector includes at least one of the number of primary UCNs, the number of UCNs corresponding to the at least one iteration, and the number of correction bits corresponding to the at least one iteration,
wherein the retraining input vector is labeled as a failure class upon a determination that the error correction decoding operation using the first error correction decoding algorithm has failed, and
wherein the first error correction decoding algorithm is selected upon a determination that the first predicted value is equal to or greater than a first reference value.

16. The electronic device of claim 15, wherein retraining component retrains the trained artificial neural network upon a determination that the first predicted value is equal to or greater than a second reference value, and wherein the second reference value is greater than the first reference value.

17. The electronic device of claim 1, further comprising:
a retraining component configured to retrain the trained artificial neural network by soft labeling a retraining input vector,
wherein the retraining input vector includes at least one of the number of primary UCNs, the number of UCNs corresponding to the at least one iteration, and the number of correction bits respectively corresponding to the at least one iteration,
wherein the retraining input vector is soft labeled as a success class upon a determination that the error correction decoding operation is successful, and
wherein the selected error correction decoding algorithm is the second error correction decoding algorithm.

18. The electronic device of claim 17, wherein the retraining component retrains the trained artificial neural network upon a determination that the number of iterations for which the second error correction decoding operation is successful is equal to or less than a third reference value.

19. The electronic device of claim 18, wherein the retraining component sets a label value for the success class higher as a number of iterations in which the second error correction decoding operation is successful is lower.

20. A method of operating an electronic device, the method comprising:
transmitting, to a trained artificial neural network, an input comprising at least one of a number of primary unsatisfied check nodes (UCNs), a number of UCNs corresponding to at least one iteration, and a number of correction bits corresponding to the at least one iteration;
selecting, based on an output of the trained artificial neural network corresponding to the input, either a first error correction decoding algorithm or a second error correction decoding algorithm; and
performing an error correction decoding operation on a read vector using the selected error correction decoding algorithm,
wherein the output of the trained artificial neural network includes a first predicted value indicative of a probability that a first error correction decoding operation using the first error correction decoding algorithm is successful.

* * * * *